United States Patent
Lee et al.

(10) Patent No.: US 11,688,314 B2
(45) Date of Patent: Jun. 27, 2023

(54) PIXEL AND DISPLAY DEVICE COMPRISING SAME

(71) Applicant: SAMSUNG DISPLAY CO., LTD., Yongin-si (KR)

(72) Inventors: Yo Han Lee, Yongin-si (KR); Sin Chul Kang, Yongin-si (KR); Su Mi Moon, Yongin-si (KR); Won Sik Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/271,477

(22) PCT Filed: Feb. 20, 2019

(86) PCT No.: PCT/KR2019/002057
§ 371 (c)(1),
(2) Date: Feb. 25, 2021

(87) PCT Pub. No.: WO2020/045777
PCT Pub. Date: Mar. 5, 2020

(65) Prior Publication Data
US 2021/0335168 A1  Oct. 28, 2021

(30) Foreign Application Priority Data
Aug. 30, 2018 (KR) .................... 10-2018-0102881

(51) Int. Cl.
*G09G 3/06* (2006.01)
*G09G 3/00* (2006.01)
(Continued)

(52) U.S. Cl.
CPC ............... *G09G 3/006* (2013.01); *G09G 3/00* (2013.01); *G09G 3/32* (2013.01); *G09G 3/3233* (2013.01);
(Continued)

(58) Field of Classification Search
CPC ............ G09G 3/00; G09G 3/006; G09G 3/22; G09G 3/30; G09G 3/32; G09G 3/3208;
(Continued)

(56) References Cited

U.S. PATENT DOCUMENTS 9,935,153 B1  4/2018  Jung et al.
10,672,946 B2  6/2020  Cho et al.
(Continued)

FOREIGN PATENT DOCUMENTS

KR  10-2016-0059569  5/2016
KR  10-2017-0101334  9/2017
(Continued)

OTHER PUBLICATIONS

Written Opinion, with English translation, corresponding to International Application No. PCT/KR2019/002057, dated Jun. 10, 2019.
(Continued)

*Primary Examiner* — Jason M Mandeville
(74) *Attorney, Agent, or Firm* — Kile Park Reed & Houtteman PLLC

(57) ABSTRACT

A pixel comprising a light emitting unit comprising at least one light emitting element; a pixel circuit for supplying current to the light emitting in response to a data signal; a sensing transistor electrically connected between a data line and a first node that is a common node of the light emitting unit and the pixel circuit; and a control transistor electrically connected between a scanning line and a gate electrode of the sensing transistor.

17 Claims, 14 Drawing Sheets

(51) Int. Cl.
*G09G 3/32* (2016.01)
*G09G 3/3233* (2016.01)
*H01L 25/16* (2023.01)
*H01L 27/15* (2006.01)
*H01L 27/12* (2006.01)

(52) U.S. Cl.
CPC .............. *G09G 2300/043* (2013.01); *G09G 2300/0413* (2013.01); *G09G 2300/0469* (2013.01); *G09G 2300/0809* (2013.01); *G09G 2300/0819* (2013.01); *G09G 2320/0295* (2013.01); *G09G 2320/045* (2013.01); *G09G 2320/0693* (2013.01); *G09G 2330/08* (2013.01); *G09G 2330/12* (2013.01); *H01L 25/167* (2013.01); *H01L 27/1214* (2013.01); *H01L 27/156* (2013.01)

(58) Field of Classification Search
CPC ............ G09G 3/3225; G09G 3/3233; G09G 2300/0413; G09G 2300/043; G09G 2300/0439; G09G 2300/0469; G09G 2300/0809; G09G 2300/0819; G09G 2320/0295; G09G 2320/045; G09G 2320/0693; G09G 2330/08; G09G 2330/12; H01L 25/167; H01L 27/1214; H01L 27/156
USPC .................................... 345/214, 76
See application file for complete search history.

(56) References Cited

U.S. PATENT DOCUMENTS

| | | | |
|---|---|---|---|
| 2009/0021498 A1* | 1/2009 | Wang | G09G 3/3648 345/204 |
| 2011/0089850 A1* | 4/2011 | Shibata | H05B 45/00 257/E33.001 |
| 2013/0135272 A1 | 5/2013 | Park | |
| 2013/0257831 A1 | 10/2013 | Kim et al. | |
| 2014/0368489 A1* | 12/2014 | Pak | G09G 3/3233 345/212 |
| 2016/0071446 A1 | 3/2016 | Miyake | |
| 2017/0250168 A1 | 8/2017 | Do et al. | |
| 2017/0330515 A1 | 11/2017 | Jeong et al. | |
| 2018/0012876 A1 | 1/2018 | Kim et al. | |
| 2018/0019369 A1 | 1/2018 | Cho et al. | |
| 2018/0019377 A1* | 1/2018 | Kim | H01L 33/38 |

FOREIGN PATENT DOCUMENTS

| | | |
|---|---|---|
| KR | 10-2018-0007025 | 1/2018 |
| KR | 10-2018-0007376 | 1/2018 |
| KR | 10-2018-0051006 | 5/2018 |
| KR | 10-1865363 | 6/2018 |
| KR | 10-1971245 | 4/2019 |

OTHER PUBLICATIONS

International Search Report, with English translation, corresponding to International Application No. PCT/KR2019/002057 dated Jun. 10, 2019.

* cited by examiner

PIXEL AND DISPLAY DEVICE COMPRISING SAME

CROSS REFERENCE TO RELATED APPLICATION(S)

This application is a national entry of International Application No. PCT/KR2019/002057, filed on Feb. 20, 2019, which claims under 35 U.S.C. §§ 119(a) and 365(b) priority to and benefits of Korean Patent Application No. 10-2018-0102881, filed on Aug. 30, 2018 in the Korean Intellectual Property Office (KIPO), the entire contents of which are incorporated herein by reference.

BACKGROUND

1. Technical Field

The disclosure relates to a pixel and a display device comprising same.

2. Description of the Related Art

A light emitting diode (LED) may have relatively satisfactory durability even under poor environmental conditions and have excellent performances in terms of lifetime and luminance. Recently, research on the technology of applying such light emitting elements to various display devices has become appreciably more active.

As a part of such research, technologies of fabricating a light emitting element having a small size, e.g., the microscale or nanoscale size, using an inorganic crystalline structure, e.g., a structure obtained by growing a nitride-based semiconductor are being developed. For example, a subminiature light emitting element may be fabricated in a small size enough to form a pixel of a self-emissive display panel, etc.

Light emitting elements are disposed between electrodes by directly growing the light emitting elements between the electrodes or by separately independently growing the light emitting elements and then disposing the light emitting elements between the electrodes. After the light emitting elements have been disposed, the electrodes and the light emitting elements are electrically connected through connection electrodes that are separately provided.

During such an alignment process of the light emitting elements, some of the light emitting elements may be not correctly electrically connected to the connection electrodes. Furthermore, some of the light emitting elements may be aligned in a first direction between the electrodes, and the other light emitting elements may be aligned in a second direction opposite to the first direction. To more efficiently drive a display panel including the light emitting elements, a display device capable of sensing the number of light emitting elements electrically connected to the connection electrodes and connection directions of the light emitting elements is required.

SUMMARY

Various embodiments of the disclosure are directed to a pixel and a display device including the pixel which includes a sensing transistor capable of easily sensing an alignment state of subminiature light emitting elements having a nanoscale size after the light emitting elements are aligned between different two electrodes.

According to an aspect of the disclosure, a pixel may include a light emitting unit configured of at least one light emitting element, a pixel circuit configured to supply current to the light emitting unit in response to a data signal, a sensing transistor electrically connected between a data line and a first node that is a common node of the light emitting unit and the pixel circuit, and a control transistor electrically connected between a scan line and a gate electrode of the sensing transistor.

Furthermore, while an enable signal is supplied from an external device to the control transistor, the control transistor may be turned on so that the scan line and the sensing transistor are electrically connected to each other.

Furthermore, the sensing transistor may be turned on by a scan signal supplied from the scan line so that the data line and the light emitting unit are electrically connected to each other.

According to an aspect of the disclosure, a display device may include a pixel comprising a light emitting unit configured of at least one light emitting element disposed such that current flows through the at least one light emitting element in a first direction or a second direction, a pixel circuit configured to supply current to the light emitting unit in response to a data signal, and a sensing transistor electrically connected between a data line and a first node that is a common node of the light emitting unit and the pixel circuit; a sensing unit electrically connected with the data line and configured to sense current flowing to the light emitting unit when the sensing transistor is turned on; and a controller configured to determine an alignment state of the at least one light emitting element based on the current sensed by the sensing unit.

Furthermore, the pixel may further include a control transistor electrically connected between a scan line and a gate electrode of the sensing transistor.

Furthermore, the controller may supply an enable signal to the control transistor of the pixel so that the control transistor is turned on.

Furthermore, when the control transistor of the pixel is turned on, the sensing transistor may be electrically connected with the scan line and is turned on in response to a scan signal supplied from the scan line so that the data line and the light emitting unit are electrically connected to each other.

Furthermore, while the enable signal is supplied to the control transistor of the pixel, the pixel circuit may be disabled.

Furthermore, the sensing unit may include an amplifier including an input terminal electrically connected to the sensing transistor, and an output terminal; a variable resistor electrically connected between the input terminal of the amplifier and the controller; and a control unit configured to determine current flowing to the light emitting unit based on an output voltage of the output terminal of the amplifier and a resistance value of the variable resistor.

Furthermore, while the enable signal is supplied to the control transistor of the pixel, the controller may supply driving power to the variable resistor and supply test power to a non-inverting input terminal of the amplifier.

Furthermore, the control unit may control the resistance value of the variable resistor such that the output voltage of the amplifier is equal to a voltage of the test power.

Furthermore, the control unit may determine current flowing to the light emitting unit based on the driving power, the test power, and the controlled resistance value of the variable resistor.

Furthermore, the current flowing to the light emitting unit may be determined based on alignment direction and alignment number of the at least one light emitting element.

Furthermore, the light emitting unit may be electrically connected between the first node and a power supply.

Furthermore, the at least one light emitting element may be aligned in either a first direction in which current flows from the first node to the power supply or a second direction in which current flows from the power supply to the first node.

Furthermore, the driving power may be set to be higher than the sensing power. The sensing power may be set to be higher than power supplied by the power supply.

Furthermore, the controller may determine the number of at least one light emitting element aligned in the first direction, based on the current sensed by the sensing unit.

Furthermore, the driving power may be set to be lower than the sensing power. The sensing power may be set to be lower than power supplied by the power supply.

Furthermore, the controller may determine the number of at least one light emitting element aligned in the second direction, based on the current sensed by the sensing unit.

In a pixel and a display device comprising the pixel according to the disclosure, an alignment state of a light emitting element with respect to electrodes in the pixel may be easily sensed, so that a display device having a defective alignment state is discerned in advance, whereby the reliability of the display device can be enhanced.

Furthermore, in the pixel and the display device according to the disclosure, since the alignment direction of the light emitting element is sensed, a driving direction of a pixel may be adaptively selected.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
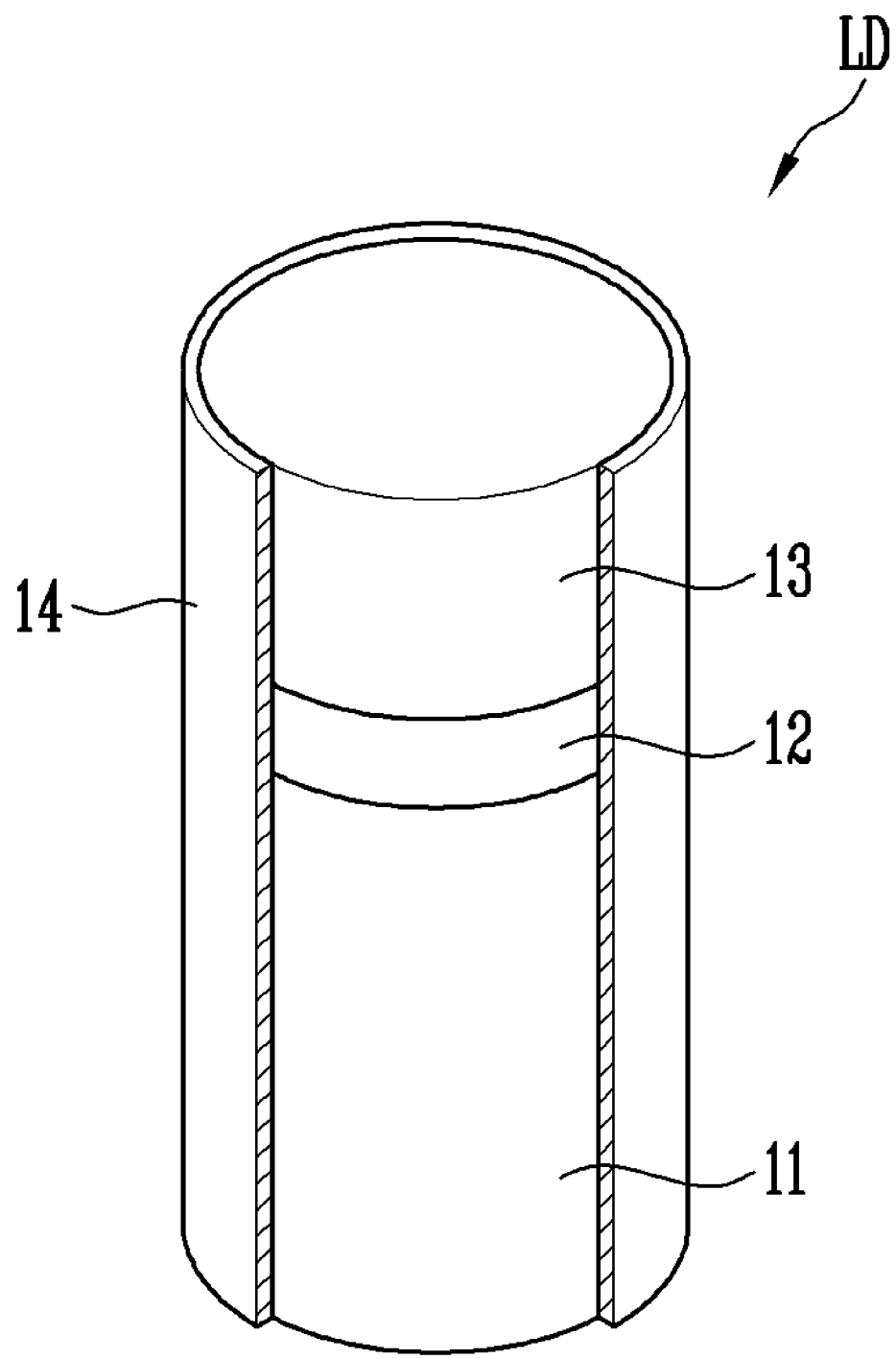
FIG. 1 is a schematic perspective view illustrating a light emitting element in accordance with an embodiment of the disclosure.

Details of various embodiments are included in the detailed descriptions and drawings. Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Advantages and features of the disclosure, and methods for achieving the same will become clear with reference to embodiments described below in detail together with the accompanying drawings. However, it is to be noted that the disclosure is not limited to the embodiments but can be embodied in various other ways. In this specification, "connected" or "coupled" refers to one component directly connected to another component or indirectly connected to another component through an intermediate component. Furthermore, for the sake of explanation, some portions may have been omitted from the drawings, and the same reference numerals are used throughout the different drawings to designate the same or similar components.

Hereinafter, a display device and a method of driving the same in accordance with an embodiment of the disclosure will be described with reference to the accompanying drawings.

FIG. 1 is a schematic perspective view illustrating a light emitting element in accordance with an embodiment of the disclosure.

In the disclosure, a light emitting element LD may be a light emitting diode LED having a nanoscale size. However, in the disclosure, the size of the light emitting element LD is not limited to a nanoscale size. The size of the light emitting element LD may be changed in various ways depending on specifications of the display device in which the light emitting element LD is disposed.

The light emitting element LD may be formed in one or more various shapes including, e.g., a cylindrical shape, a cuboidal shape, and a polyprism shape. FIG. 1 illustrates a cylindrical light emitting element by way of example. The light emitting element LD may be provided in the form of a rod extending in one direction. Here, the rod shape may include a rod-like shape or a bar-like shape extending in the longitudinal direction (e.g., to have an aspect ratio greater than 1). For example, the length of the light emitting element LD may be greater than the diameter thereof.

The light emitting element LD may be employed as a light source for various display devices. For example, the light emitting element LD may be used as a device or a self-emissive display device and may emit any one of red light, green light, blue light, and white light.

Referring to FIG. 1, the light emitting element LD in accordance with an embodiment of the disclosure may include a first conductive semiconductor layer 11, a second conductive semiconductor layer 13, and an active layer 12 interposed between the first and second conductive semiconductor layers 11 and 13. For example, the light emitting element LD may be implemented as a stacked body formed by successively stacking the first conductive semiconductor layer 11, the active layer 12, and the second conductive semiconductor layer 13.

If the extension direction of the light emitting element LD is defined as the longitudinal direction, the light emitting element LD may have a first end and a second end in the extending direction. One of the first and second conductive semiconductor layers 11 and 13 may be disposed on the first end, and the other of the first and second conductive semiconductor layers 11 and 13 may be disposed on the second end.

The first conductive semiconductor layer 11 may include, for example, at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn. The material forming the first conductive semiconductor layer 11 is not limited to this, and the first conductive semiconductor layer 11 may be formed of various other materials.

The active layer 12 may be formed on the first conductive semiconductor layer 11 and may have a single or multiple quantum well structure. In an embodiment of the disclosure, a cladding layer (not shown) doped with a conductive dopant may be formed on and/or under the active layer 12. For example, the cladding layer may be formed of an AlGaN layer or an InAlGaN layer. Material such as AlGaN or AlInGaN may be employed to form the active layer 12. If an electric field of a predetermined voltage or more is applied to the opposite ends of the light emitting element LD, the light emitting element LD may emit light by coupling of electron-hole pairs in the active layer 12.

The second conductive semiconductor layer 13 may be provided on the active layer 12 and may include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which includes at least one semiconductor material of InAlGaN, GaN, AlGaN, InGaN, AlN, and InN, and is doped with a second conductive dopant such as Mg. The material forming the second conductive semiconductor layer 13 is not limited to this, and the second conductive semiconductor layer 13 may be formed of various other materials.

In an embodiment of the disclosure, the light emitting element LD may not only include the first conductive semiconductor layer 11, the active layer 12, and the second conductive semiconductor layer 13, but may also include a fluorescent layer, another active layer, another semiconductor layer, and/or an electrode layer provided on and/or under each layer.

In an embodiment, the light emitting element LD may further include an electrode layer (not illustrated) provided over the first conductive semiconductor layer 11 and/or the second conductive semiconductor layer 13. The electrode layer may include metal or a metal oxide. For example, chrome (Cr), titanium (Ti), aluminum (Al), gold (Au), nickel (Ni), ITO, and an oxide or alloy thereof may be used alone or in combination with each other. However, the disclosure is not limited to this.

The light emitting element LD may further include an insulating film 14. In an embodiment of the disclosure, the insulating film 14 may be omitted or may be provided to cover only some portion(s) of the first conductive semiconductor layer 11, the active layer 12, and the second conductive semiconductor layer 13. For example, the insulating film 14 may be provided on a portion of the light emitting element LD, other than the opposite ends thereof, so that the opposite ends of the light emitting element LD may be exposed. Although in FIG. 1 there is illustrated the insulating film 14 from which a portion thereof has been removed for the sake of explanation, the actual light emitting element LD may be formed such that the entirety of the side surface of the cylindrical body thereof is enclosed by the insulating film 14. The insulating film 14 may be provided to enclose at least a portion of an outer circumferential surface of the first conductive semiconductor layer 11, the active layer 12, and/or the second conductive semiconductor layer 13. For example, the insulating film 14 may be provided to enclose at least the outer circumferential surface of the active layer 12.

In an embodiment of the disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film 14 is provided on the light emitting element LD, the active layer 12 may be prevented from short-circuiting with a first and/or second electrode. Thanks to the insulating film 14, occurrence of a defect on the surface of the light emitting element LD may be minimized, whereby the lifetime and efficiency of the light emitting element LD may be improved. Even in case that rod-type LEDs LD are disposed adjacent to each other, the insulating film 14 may prevent the rod-type LEDs LD from undesirably short-circuiting therebetween.

Figure 2:
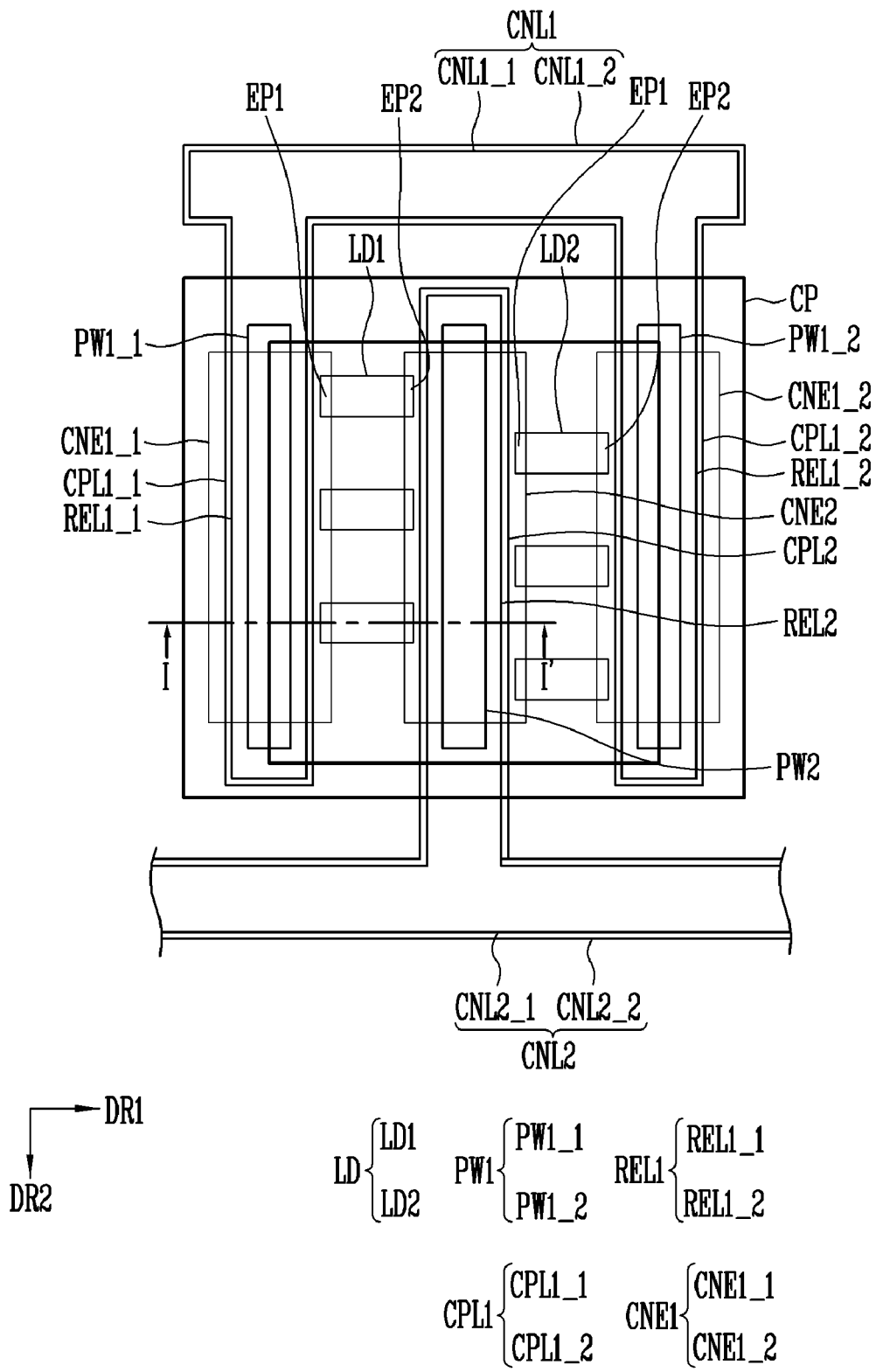
FIG. 2 is a schematic plan view illustrating an emission area including the light emitting element of FIG. 1.
Figure 3:
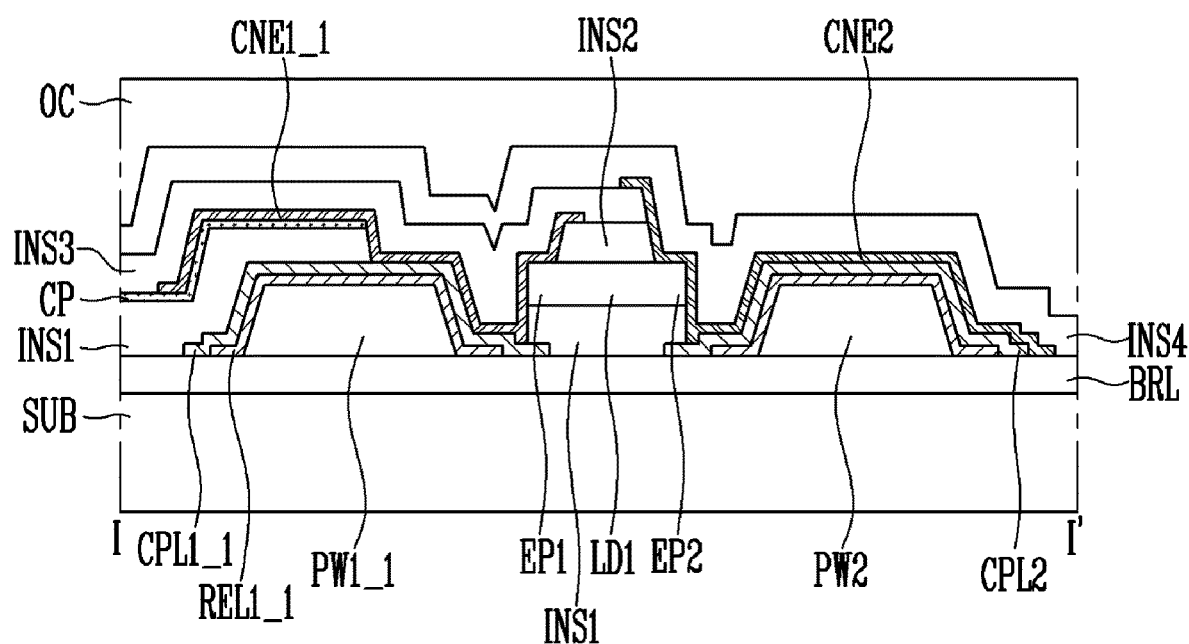
FIG. 3 is a schematic cross-sectional view taken along line I-I' of FIG. 2.

FIG. 2 is a schematic plan view illustrating an emission area including the light emitting element of FIG. 1. FIG. 3 is a schematic cross-sectional view taken along line I-I' of FIG. 2.

In FIG. 2, a light emitting unit EMU (see also FIG. 4) may be a pixel area (or a sub-pixel area) of each of pixels (or sub-pixels) forming (or constituting) an active emission display panel. In FIG. 2, there is illustrated an example where light emitting elements are aligned in a horizontal direction. However, the arrangement of the light emitting elements is not limited to the example illustrated in FIG. 2. In an embodiment, the light emitting elements may be aligned in a diagonal direction between first and second electrodes.

Referring to FIGS. 2 and 3, the light emitting device in accordance with an embodiment of the disclosure may include a substrate SUB, a barrier layer BRL, light emitting elements LD, first and second party walls PW1 and PW2, first and second reflective electrodes REL1 and REL2, and first and second contact electrodes CNE1 and CNE2. The first reflective electrode REL1 may include right and left reflective electrode REL1_1 and REL1_2. The first party wall PW1 may include left and right party walls PW1_1 and PW1_2. The first contact electrodes CNE1 may include left and right contact electrodes CNE1_1 and CNE1_2. A conductive pattern CP may be disposed on the first insulating layer INS1 and may be a shied electrode.

The substrate SUB may include insulating material such as glass, an organic polymer, or crystal. The substrate SUB may be made of material having flexibility so as to be bendable or foldable and may have a single-layer or multi-layer structure. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may be changed in various ways.

The barrier layer BRL may prevent impurities from diffusing into the light emitting elements LD.

The light emitting element LD may include a first end EP1 and a second end EP2 with respect to a first direction DR1. One of the first and second conductive semiconductor layers 11 and 13 may be disposed on the first end EP1, and the other of the first and second conductive semiconductor layers 11 and 13 may be disposed on the second end EP2.

In an embodiment of the disclosure, a first insulating layer INS1 may be provided on a first capping layer CPL1, and a second insulating layer INS2 for covering a portion of an upper surface of the light emitting element LD may be provided on the light emitting element LD. The opposite ends EP1 and EP2 of the light emitting element LD may be exposed to the outside through areas that are not covered by the second insulating layer INS2.

The first and second party walls PW1 and PW2 may define the light emitting unit EMU in one pixel PXL. The first and second party walls PW1 and PW2 may be disposed on the substrate SUB at positions spaced apart from each other. The first and second party walls PW1 and PW2 on the substrate SUB may be spaced apart from each other by a distance equal to or greater than the length of one light emitting element LD. The first and second party walls PW1 and PW2 may be formed of insulating material including inorganic material or organic material, but the disclosure is not limited thereto. The first and second party walls PW1 and PW2 each may have a trapezoidal shape having side surfaces inclined at a predetermined angle, as illustrated in FIG. 3. As another example, each of the first and second party walls PW1 and PW2 may have a semicircular shape. However, in various embodiments of the disclosure, each of the first and second party walls PW1 and PW2 may have one or more various shapes such as a semielliptical shape, a circular shape, and a rectangular shape.

The first reflective electrode REL1 may be provided on the first party wall PW1. The first reflective electrode REL1 may be disposed adjacent to either the first or second ends EP1 or EP2 of each light emitting element LD, and may be electrically connected to the light emitting element LD through the first contact electrode CNE1. The second reflective electrode REL2 may be provided on the second party wall PW2. The second reflective electrode REL2 may be disposed adjacent to the other end of the first and second ends EP1 and EP2 of each light emitting element LD.

Any one of the first and second reflective electrodes REL1 and REL2 may be an anode electrode, and the other reflective electrode may be a cathode electrode. In an embodiment of the disclosure, the first reflective electrode REL1 may be an anode electrode, and the second reflective electrode REL2 may be cathode electrode.

The first reflective electrode REL1 and the second reflective electrode REL2 may be disposed on the same plane and may have the same height. If the first reflective electrode REL1 and the second reflective electrode REL2 have the same height, the light emitting element LD may be more reliably connected to the first and second reflective electrodes REL1 and REL2.

Although for the sake of explanation the first and second reflective electrodes REL1 and REL2 are illustrated as being directly provided on the substrate SUB, the disclosure is not limited thereto. For example, a component for enabling the display device to be driven as a passive matrix or an active matrix may be further provided between the substrate SUB and the first and second reflective electrodes REL1 and REL2.

In various embodiments of the disclosure, as illustrated in FIG. 2, in the light emitting unit EMU, two first reflective electrodes REL1 and one second reflective electrode REL2 may be alternately arranged, and light emitting elements LD may be aligned between the first reflective electrode REL1 and the second reflective electrode REL2 that are adjacent to each other. However, the disclosure is not limited to this. Compared to those of the embodiment illustrated in FIG. 2, a larger or smaller number of first reflective electrodes REL1 or second reflective electrodes REL2 may be arranged.

At least a portion of the first and second reflective electrodes REL1 and REL2 may respectively have shapes corresponding to those of the first and second party walls PW1 and PW2. For example, at least a portion of the first reflective electrode REL1 may have an inclination corresponding to an inclination of the first party wall PW1, and at least a portion of the second reflective electrode REL2 may have an inclination corresponding to an inclination of the second party wall PW2.

In an embodiment of the disclosure, the first and second reflective electrodes REL1 and REL2 may be formed of conductive material having a predetermined reflectivity. The first and second reflective electrodes REL1 and REL2 enable light emitted from the opposite ends EP1 and EP2 of the light emitting element LD to travel in a direction (e.g., a frontal direction) in which an image is displayed. In case that the first and second reflective electrodes REL1 and REL2 have shapes corresponding to the shapes of the first and second party walls PW1 and PW2, light emitted from the opposite ends EP1 and EP2 of each of the light emitting elements LD may be reflected by the first and second reflective electrodes REL1 and REL2, whereby the light may more effectively travel in the frontal direction. Consequently, the efficiency of light emitted from the light emitting element LD may be enhanced. In such an embodiment, the first and second party walls PW1 and PW2, along with the first and second reflective electrodes REL1 and REL2 provided on the first and second party walls PW1 and PW2, may function as reflective components for enhancing the efficiency of light emitted from each of the light emitting elements LD.

In the case where a light emitting device is driven as an active matrix, for example, signal lines, an insulating layer, and/or a transistor may be provided between the substrate SUB and the first and second reflective electrodes REL1 and REL2. The signal lines may include a scan line, a data line, a power line, etc. The transistor may be electrically connected to the signal lines and may include a gate electrode, a semiconductor layer, a source electrode, and a drain electrode. One electrode of the source and drain electrodes of the transistor may be electrically connected to any one electrode of the first and second reflective electrodes REL1 and REL2. A data signal of the data line may be applied to the any one electrode through the transistor. Here, the numbers and shapes of signal lines, insulating layer, and/or transistors may be changed in various ways.

The first reflective electrode REL1 may have a bar shape extending in the second direction DR2 intersecting the first direction DR1. The first reflective electrode REL1 may be electrically connected to a 1-1-th connection line CNL1_1 extending in the first direction DR1. The 1-1-th connection line CNL1_1 may be integrally provided with the first reflective electrode REL1 The 1-1-th connection line CNL1_1 may be electrically connected to the transistor through a contact hole (not illustrated). A signal provided to the transistor may be applied to the first reflective electrode REL1 through the 1-1-th connection line CNL1_1.

The second reflective electrode REL2 may be electrically connected to a 2-1-th connection line CNL2_1 extending in the first direction DR1. The 2-1-th connection line CNL2_1 may be integrally provided with the second reflective electrode REL2 and extend in the first direction DR1. In the case where the light emitting device is driven as an active matrix, the 2-1-th connection line CNL2_1 may be electrically connected to the signal line through a contact hole (not illustrated). A voltage of the signal line may be applied to the second reflective electrode REL2 through the 2-1-th connection line CNL2_1. For example, in the case where the second power supply VSS is applied to the signal line, the second power supply VSS may be applied to the second reflective electrode REL2 through the 2-1-th connection line CNL2_1.

The first and second reflective electrodes REL1 and REL2 and the 1-1-th and 2-1-th connection lines CNL1_1 and CNL2_1 may be formed of conductive material. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT. The first and second reflective electrodes REL1 and REL2 and the 1-1-th and 2-1-th connection lines CNL1_1 and CNL2_1 each may have a single layer. However, the disclosure is not limited to this. For example, the first and second reflective electrodes REL1 and REL2 and the 1-1-th and 2-1-th connection lines CNL1_1 and CNL2_1 each may have a multi-layer structure formed by stacking two or more kinds of material among metals, alloys, conductive oxides, and conductive polymers. Here, the material of the first and second reflective electrodes REL1 and REL2 and the 1-1-th and 2-1-th connection lines CNL1_1 and CNL2_1 is not limited to the foregoing materials. For example, the first and second reflective electrodes REL1 and REL2 and the 1-1-th and 2-1-th connection lines CNL1_1 and CNL2_1 may be made of conductive material having a predetermined reflectivity to allow light emitted from the opposite ends EP1 and EP2 of each of the light emitting elements LD to travel in a direction (e.g., in the frontal direction) in which an image is displayed.

The first contact electrode CNE1 may be provided on the first reflective electrode REL1 to electrically and/or physically reliably connect the first reflective electrode REL1 with any one of the opposite ends EP1 and EP2 of each of the light emitting elements LD. The first contact electrode CNE1 may be formed of transparent conductive material to allow light emitted from each of the light emitting elements LD and/or reflected in the frontal direction by the first reflective electrode REL1 to travel in the frontal direction without loss. For example, the transparent conductive material may include ITO, IZO, ITZO, etc. The material of the first contact electrode CNE1 is not limited to the above-mentioned materials.

In a plan view, the first contact electrode CNE1 may cover the first reflective electrode REL1 and overlap the first reflective electrode REL1. For example, the first contact electrode CNE1 may at least partially overlap one of the opposite ends EP1 and EP2 of each of the light emitting elements LD.

A third insulating layer INS3 for covering the first contact electrode CNE1 may be provided on the first contact electrode CNE1. The third insulating layer INS3 may prevent the first contact electrode CNE1 from being exposed to the outside, preventing the first contact electrode CNE1 from corroding. The third insulating layer INS3 may be an inorganic insulating layer including inorganic material or an organic insulating layer including organic material. Although the third insulating layer INS3 may have a single layer structure as shown in the drawing, the disclosure is not limited thereto. For example, the third insulating layer INS3 may have a multi-layer structure. In the case where the third insulating layer INS3 has a multi-layer structure, the third insulating layer INS3 may have a structure formed by alternately stacking inorganic insulating layers and organic insulating layers. For example, the third insulating layer INS3 may have a structure formed by sequentially stacking a first inorganic insulating layer, an organic insulating layer, and a second inorganic insulating layer.

The second contact electrode CNE2 may be provided on the second reflective electrode REL2. In a plan view, the second contact electrode CNE2 may cover the second reflective electrode REL2 and overlap the second reflective electrode REL2. For example, the second contact electrode CNE2 may at least partially overlap the other of the opposite ends EP1 and EP2 of each of the light emitting elements LD. The second contact electrode CNE2 may be made of the same material as that of the first contact electrode CNE1, but it is not limited thereto.

A fourth insulating layer INS4 for covering the second contact electrode CNE2 may be provided on the second contact electrode CNE2. The fourth insulating layer INS4 may prevent the second contact electrode CNE2 from being exposed to the outside, thus preventing the second contact electrode CNE2 from being corroded. The fourth insulating layer INS4 may be formed of either an inorganic insulating layer or an organic insulating layer.

An overcoat layer OC may be provided on the fourth insulating layer INS4. The overcoat layer OC may be a planarization layer for mitigating a height difference formed by the first and second party walls PW1 and PW2, the first and second reflective electrodes REL1 and REL2, the first and second contact electrodes CNE1 and CNE2, etc. that are disposed under the overcoat layer OC. The overcoat layer OC may be an encapsulation layer for preventing oxygen or water from penetrating into the light emitting elements LD. In some embodiments, the overcoat layer OC may be omitted. In the case where the overcoat layer OC is omitted, the fourth insulating layer INS4 may function as an encapsulation layer for preventing oxygen or water from penetrating into the light emitting elements LD.

As described above, the first end EP1 of the light emitting element LD may be electrically connected to the first reflective electrode REL1, and the second end EP2 thereof may be electrically connected to the second reflective electrode REL2. For example, the first conductive semiconductor layer 11 of the light emitting element LD may be electrically connected to the first reflective electrode REL1, and the second conductive semiconductor layer 13 of the light emitting element LD may be electrically connected to one side of the second reflective electrode REL2. Hence, the first and second conductive semiconductor layers 11 and 13 of the light emitting element LD may be supplied with predetermined voltages through the first reflective electrode REL1 and the second reflective electrode REL2. If an electric field having a voltage equal to or greater than a predetermined voltage is applied to the opposite ends EP1 and EP2 of the light emitting element LD, the light emitting element LD emits light by coupling of electron-hole pairs in the active layer 12.

Each light emitting unit EMU of the light emitting device may further include a first capping layer CPL1 and a second capping layer CPL2. The first capping layer CPL1 may include left and right capping layers CPL1_1 and CPL1_2.

The first capping layer CPL1 may be provided on the first reflective electrode REL1 The first capping layer CPL1 may prevent the first reflective electrode REL1 from being damaged by defects or the like caused during a process of fabricating the light emitting device and may increase adhesive force between the first reflective electrode REL1 and the substrate SUB. The first capping layer CPL1 may be formed of transparent conductive material such as IZO to minimize loss of light emitted from each of the light emitting elements LD and/or reflected by the first reflective electrode REL1 in the frontal direction.

The first capping layer CPL1 may be connected to the 1-2-th connection line CNL1_2 extending in the first direction DR1. The 1-2-th connection line CNL1_2 may be integrally provided with the first capping layer CPL1 and may include the same material as that of the first capping layer CPL1. The 1-2-th connection line CNL1_2 may be provided on the 1-1-th connection line CNL1_1 and may overlap the 1-1-th connection line CNL1_1 in a plan view. The 1-1-th connection line CNL1_1 and the 1-2-th connection line CNL1_2 may form the first connection line CNL1 in the light emitting unit EMU.

The second capping layer CPL2 may be provided on the second reflective electrode REL2. The second capping layer CPL2 may prevent the second reflective electrode REL2 from being damaged by defects or the like caused during a process of fabricating the light emitting device and may increase adhesive force between the second reflective electrode REL2 and the substrate SUB. The second capping layer CPL2 and the first capping layer CPL1 may be provided on the same layer and may include the same material.

The second capping layer CPL2 may be connected to the 2-2-th connection line CNL2_2 extending in the first direction DR1. The 2-2-th connection line CNL2_2 may be integrally provided with the second capping layer CPL2 and may include the same material as that of the second capping layer CPL2. The 2-2-th connection line CNL2_2 may be provided on the 2-1-th connection line CNL2_1, and may overlap the 2-1-th connection line CNL2_1 in a plan view. The 2-1-th connection line CNL2_1 and the 2-2-th connection line CNL2_2 may form the second connection line CNL2 in the light emitting unit EMU.

Hereinafter, the configuration of the display device according to an embodiment of the disclosure will be described in a stacking sequence with reference to FIGS. 2 and 3.

The first and second party walls PW1 and PW2 may be provided on the substrate SUB on which the barrier layer BRL is provided. The first and second party walls PW1 and PW2 may be disposed on the barrier layer BRL at positions spaced apart from each other by a predetermined distance.

The first reflective electrode REL1 may be provided on the first party wall PW1. The second reflective electrode REL2 may be provided on the second party wall PW2. The first and second reflective electrodes REL1 and REL2 may be provided on the same plane on the corresponding party walls and may have shapes corresponding to the shapes of the corresponding party walls, respectively.

The first capping layer CPL1 may be provided on the first reflective electrode REL1 The second capping layer CPL2 may be provided on the second reflective electrode REL2.

The light emitting elements LD may be aligned on the substrate SUB. The light emitting elements LD may be induced to be self-aligned by an electric field formed between the first and second reflective electrodes REL1 and REL2 and be provided between the first and second reflective electrodes REL1 and REL2. In case that the light emitting elements LD are aligned, some of the light emitting elements LD may not correctly come into contact with either the first reflective electrode REL1 or the second reflective electrode REL2. In some of the light emitting elements LD, the first conductive semiconductor layer 11 may be electrically connected to the first reflective electrode REL1, and the second conductive semiconductor layer 13 may be electrically connected to the second reflective electrode REL2 (e.g., in a first direction, or a forward direction). On the other hand, in some other(s) of the light emitting elements LD, the first conductive semiconductor layer 11 may be electrically connected to the second reflective electrode REL2, and the second conductive semiconductor layer 13 may be electrically connected to the first reflective electrode REL1 (e.g., in a second direction, or a backward direction). Here, some of the light emitting elements LD and some other(s) may have different connection polarities for the first and second reflective electrodes REL1 and REL2.

The second insulating layer INS2 for covering portions of the upper surfaces of the light emitting elements LD may be provided on the light emitting elements LD. The second insulating layer INS2 may be formed of an inorganic insulating layer including inorganic material, or an organic insulating layer including organic material.

The first contact electrode CNE1 may be provided on the substrate SUB on which the second insulating layer INS2 is provided. The first contact electrode CNE1 may cover the first capping layer CPL1 and may be electrically connected to the first reflective electrode REL1 through the first capping layer CPL1. In an embodiment, in the case where the first capping layer CPL1 is omitted, the first contact electrode CNE1 may be directly provided on the first reflective electrode REL1 and may be directly connected to the first reflective electrode REL1.

The third insulating layer INS3 may be provided on the substrate SUB on which the first contact electrode CNE1 is provided. The third insulating layer INS3 may be provided on the substrate SUB to cover the first contact electrode CNE1 and the second insulating layer INS2.

The second contact electrode CNE2 may be provided on the substrate SUB on which the third insulating layer INS3 is provided. The second contact electrode CNE2 may cover the second capping layer CPL2 and may be electrically connected to the second reflective electrode REL2 through the second capping layer CPL2. In an embodiment, in the case where the second capping layer CPL2 is omitted, the second contact electrode CNE2 may be directly provided on the second reflective electrode REL2 and may be directly connected to the second reflective electrode REL2.

The fourth insulating layer INS4 may be provided on the substrate SUB on which the second contact electrode CNE2 is provided. An overcoat layer OC may be provided on the fourth insulating layer INS4.

Figure 4:
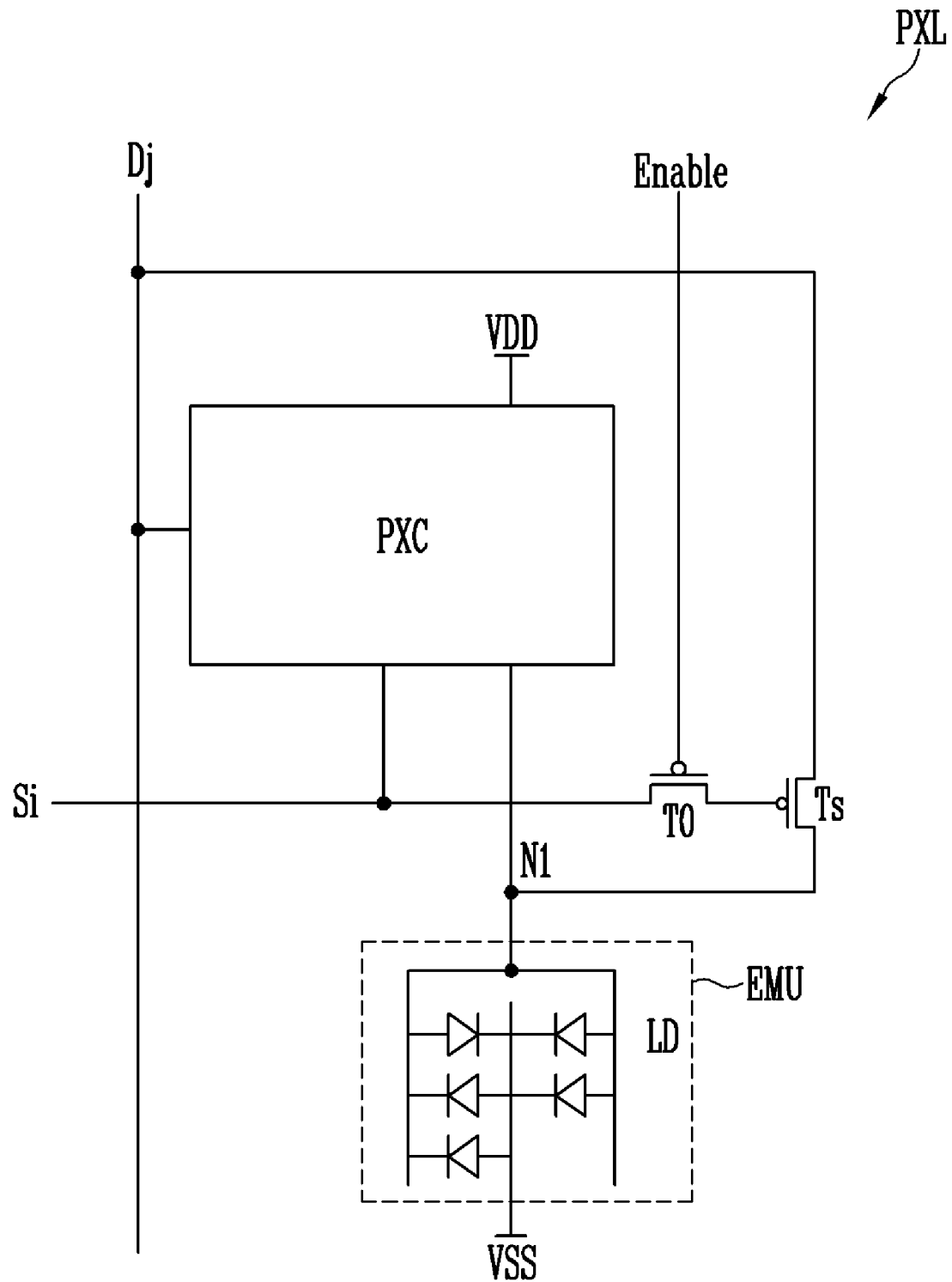
FIG. 4 is a schematic circuit diagram illustrating a pixel in accordance with an embodiment of the disclosure.

FIG. 4 is a schematic circuit diagram illustrating a pixel in accordance with an embodiment of the disclosure. FIG. 4 illustrate examples of a pixel that forms an active emission display panel. In the following embodiments, it can be understood that a pixel includes a sub-pixel or corresponds to the sub-pixel.

Referring to FIG. 4, a pixel PXL may include a light emitting unit EMU configured to generate light having a luminance corresponding to a data signal, a sensing transistor Ts, a control transistor T0, and a pixel circuit PXC configured to drive the light emitting unit EMU.

In an embodiment, the light emitting unit EMU may include light emitting elements LD, including first light emitting elements LD1 and second light emitting elements LD2, electrically connected in parallel to each other between the pixel circuit PXC and the second power supply VSS. Here, the light emitting elements LD may be electrically connected to the first power supply VDD via the pixel circuit PXC. The light emitting unit EMU may be a single light emitting element LD.

As described above, in case that the light emitting elements LD are aligned, in some of the light emitting elements LD, the first conductive semiconductor layer 11 may be electrically connected to the first reflective electrode REL1, and the second conductive semiconductor layer 13 may be electrically connected to the second reflective electrode REL2 (e.g., in a first direction). On the other hand, in some other(s) of the light emitting elements LD, the first conductive semiconductor layer 11 may be electrically connected to the second reflective electrode REL2, and the second conductive semiconductor layer 13 may be electrically connected to the first reflective electrode REL1 (e.g., in a second direction). Hence, as illustrated in FIG. 4, the light emitting unit EMU may include at least one light emitting element LD aligned in the first direction and at least one light emitting element LD aligned in the second direction.

The first and second power supplies VDD and VSS may have different potentials to allow the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the pixel PXL.

Each light emitting unit EMU may emit light having a luminance corresponding to driving current supplied thereto through the pixel circuit PXC. In the disclosure, the pixel circuit PXC may have one or more various known shapes. The pixel circuit PXC in accordance with several embodiments will be illustrated in FIG. 11. Detailed configurations of various embodiments of the pixel circuit PXC will be described below herein with reference to FIG. 11.

The sensing transistor Ts is electrically connected between a j-th data line Dj and a first node N1 that is a common node of the light emitting unit EMU and the pixel circuit PXC. The sensing transistor Ts may be turned on by a control transistor T0 to be described below and electrically connect the light emitting unit EMU with the data line Dj. If the sensing transistor Ts is turned on, current supplied through the data line Dj flows to the light emitting unit EMU via the sensing transistor Ts.

The control transistor T0 may be electrically connected between an i-th scan line Si and a gate electrode of the sensing transistor Ts. The control transistor T0 may be turned on while an enable signal Enable is supplied thereto from an external device, and thus electrically connect the i-th scan line Si with the sensing transistor Ts. While the control transistor T0 is turned on, the sensing transistor Ts may be turned on by a scan signal supplied through the i-th scan line Si.

In various embodiments of the disclosure, in case that the voltage of the first node N1 is set to a potential higher than that of the second power supply VSS, current can flow through the at least one light emitting element LD aligned in the first direction among the light emitting elements LD. On the contrary, in case that the voltage of the first node N1 is set to a potential lower than that of the second power supply, current can flow through the at least one light emitting element LD aligned in the second direction among the light emitting elements LD. Here, depending on the number of light emitting elements LD that are aligned in a specific direction in which current flows, the size of current flowing through the overall light emitting unit EMU may be determined. As a result, the size and direction of current flowing through the light emitting unit EMU may be determined depending on the alignment state (connection state) of the light emitting elements LD.

In other words, in case that the sensing transistor Ts is turned on, in response to the voltage of the first node N1, current may flow from the data line Dj to the second power supply VSS via the light emitting unit EMU or flow from the second power supply VSS to the data line Dj via the light emitting unit EMU. Therefore, by measuring the direction of the current corresponding to the voltage of the first node N1 and the amount of current Id flowing at this time, the alignment state of the light emitting elements LD forming the light emitting unit EMU can be determined.

A display device 10 in accordance with the disclosure may include a sensing unit 140 electrically connected to the data line Dj to measure the current Id that flows through the data line Dj. Hereafter, detailed configuration of the display device 10 will be described.

Figure 5:
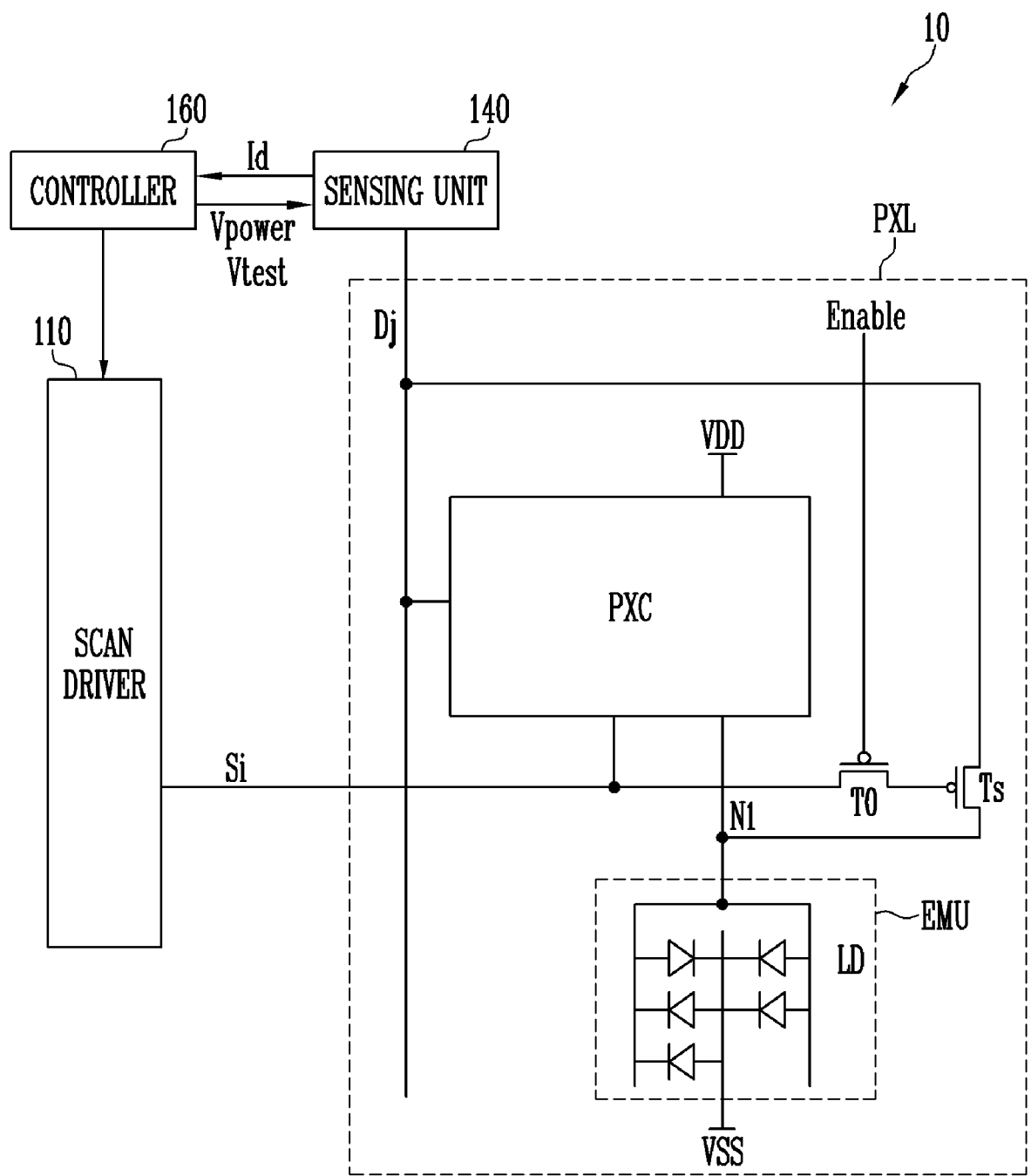
FIG. 5 is a schematic plan view of a display device in accordance with an embodiment of the disclosure.
Figure 6:
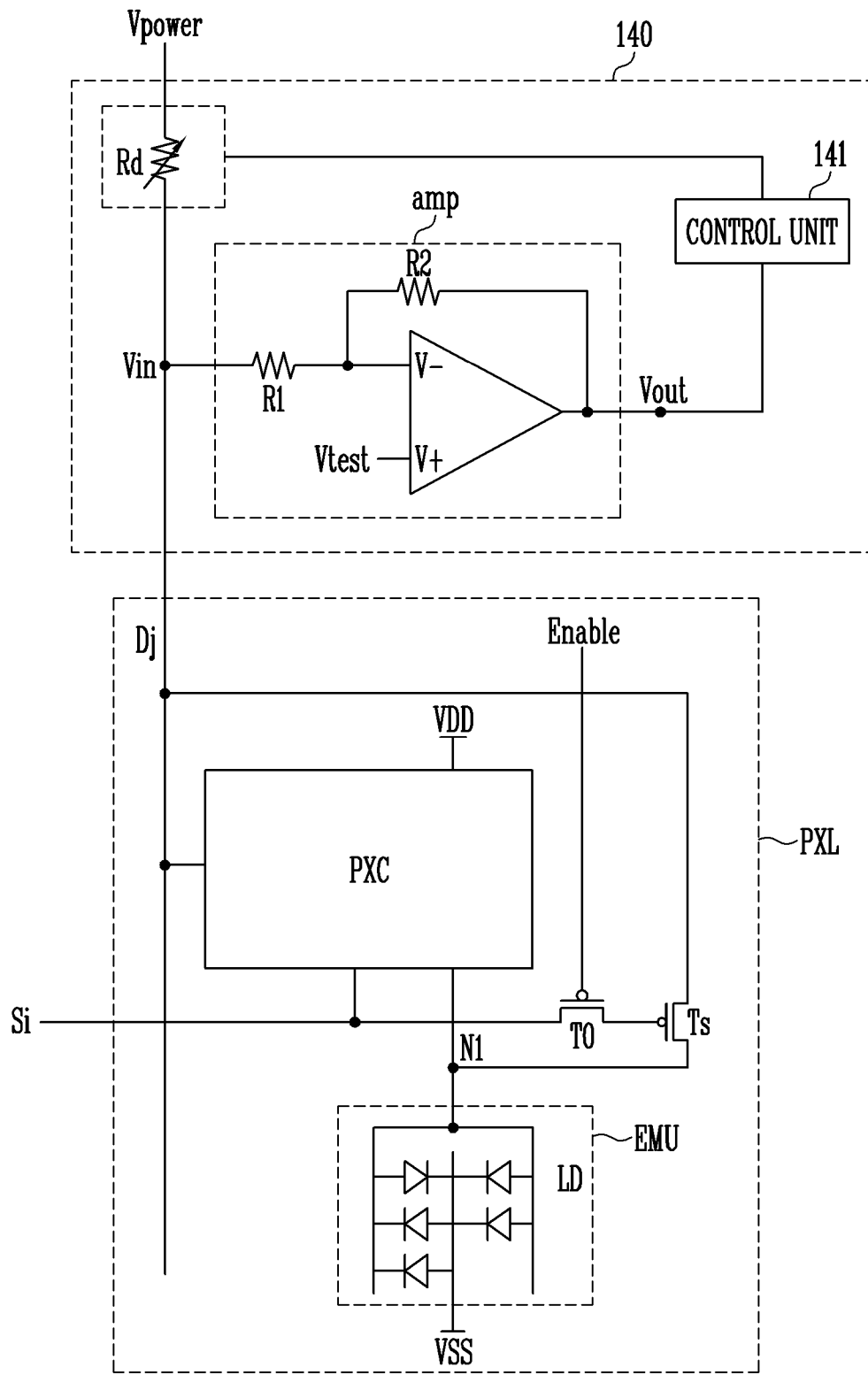
FIG. 6 is a schematic circuit diagram illustrating in detail a sensing unit in accordance with an embodiment of the disclosure.
Figure 7A:
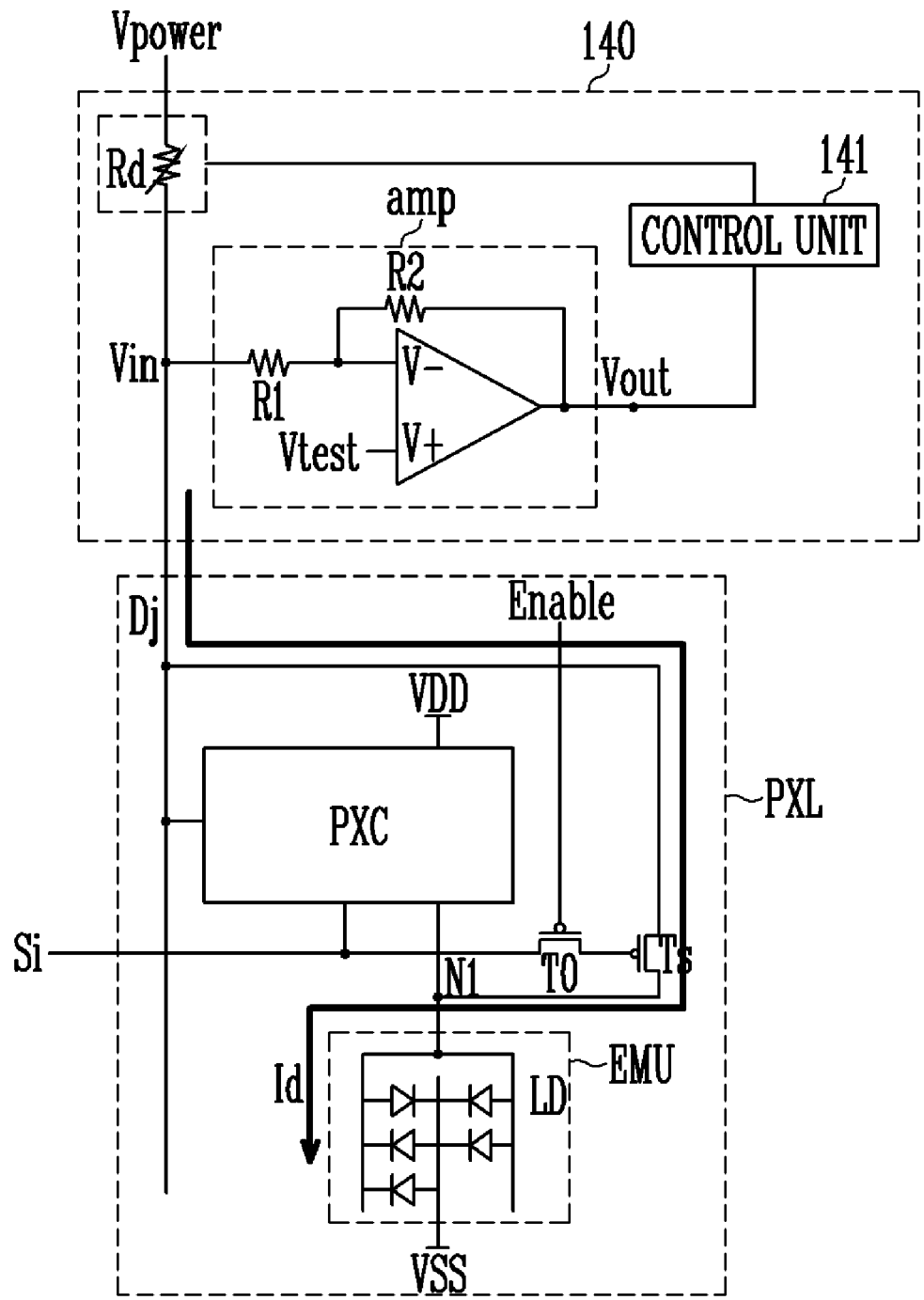
FIGS. 7A and 7B are schematic circuit diagrams illustrating an embodiment of the operation of the display device in accordance with the disclosure.
Figure 7B:
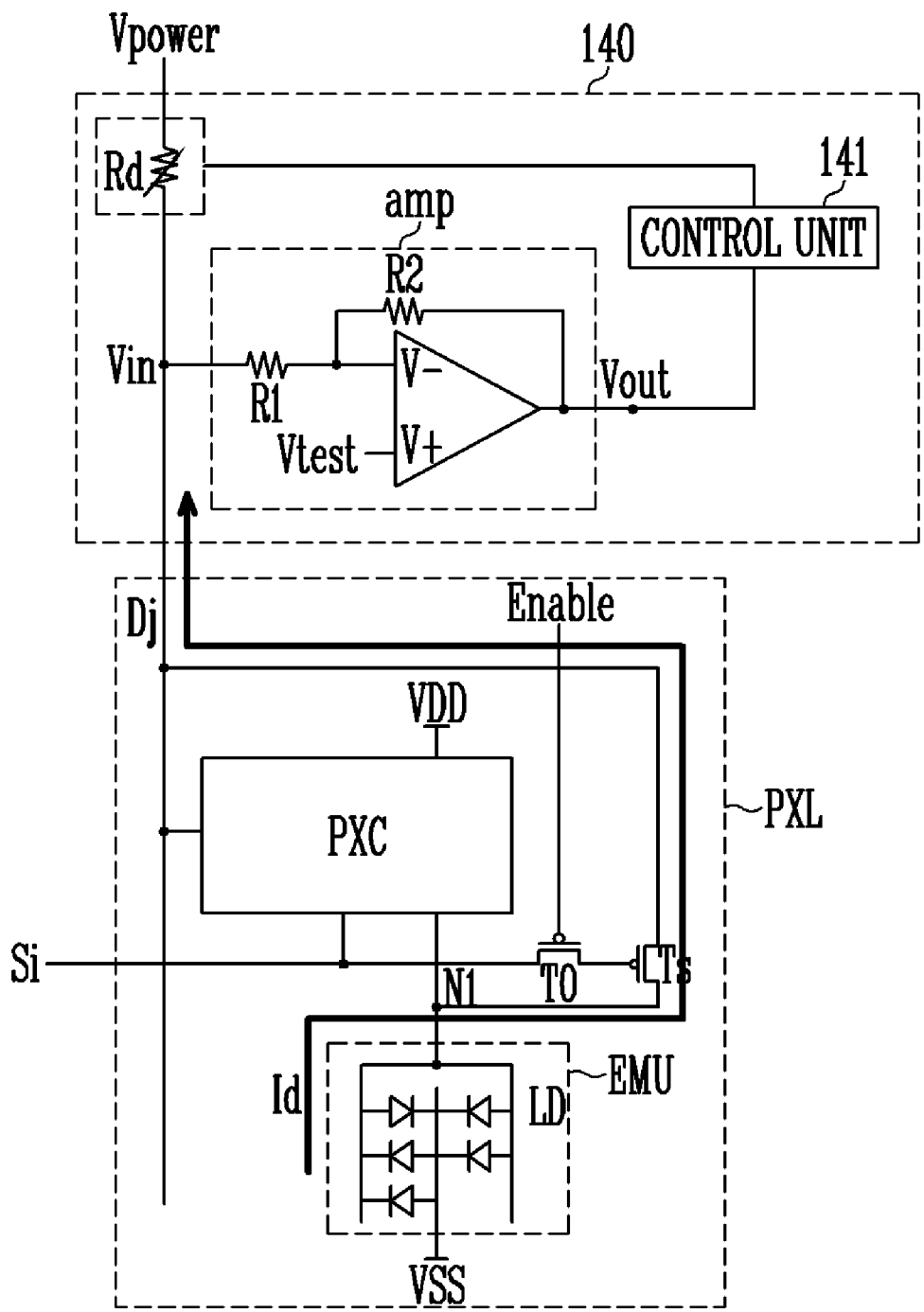
Figure 8:
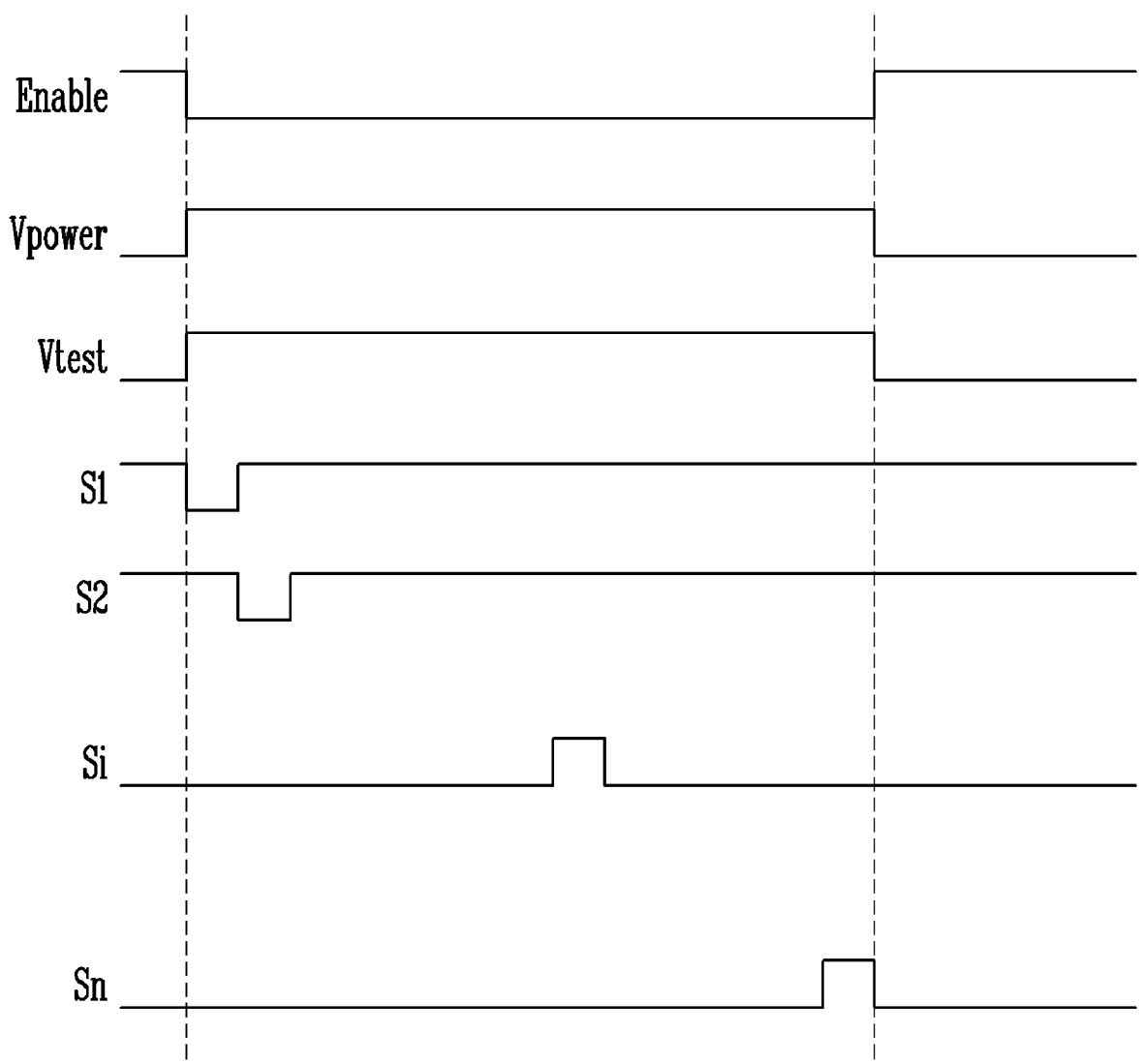
FIG. 8 is a schematic timing diagram according to the operation of the display device in accordance with the disclosure.
Figure 9:
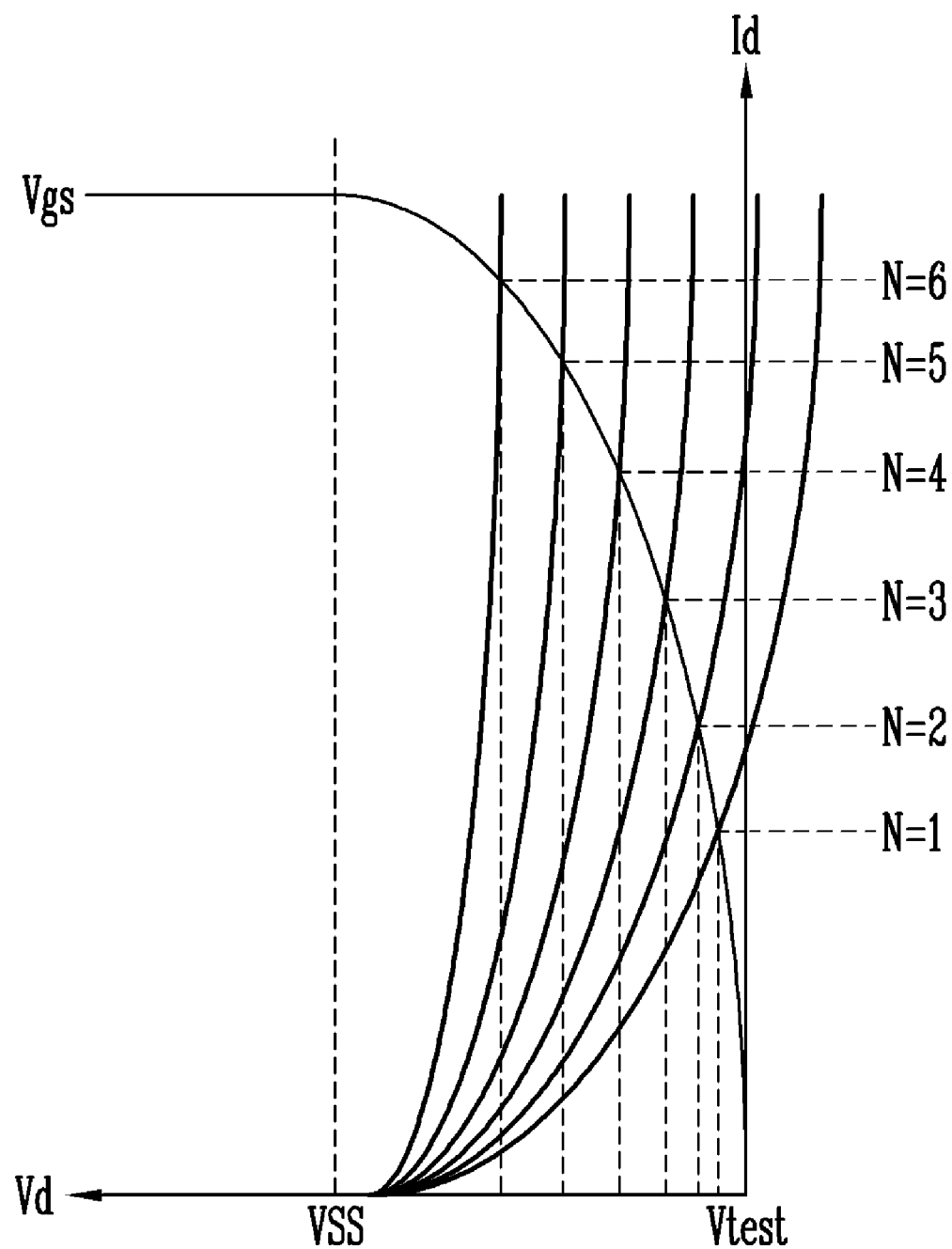
FIG. 9 is a schematic graph illustrating a Vgs curve of a sensing transistor according to characteristics of a light emitting unit.

FIG. 5 is a schematic plan view of a display device in accordance with an embodiment of the disclosure and, specifically, a schematic plan view of a display device including the pixels PXL illustrated in FIG. 4. FIG. 6 is a schematic circuit diagram illustrating in detail a sensing unit in accordance with an embodiment of the disclosure. FIGS. 7A and 7B are schematic block diagrams illustrating an embodiment of the operation of the display device in accordance with the disclosure. FIG. 8 is a schematic timing diagram according to the operation of the display device in accordance with the disclosure. FIG. 9 is a schematic graph illustrating a Vgs curve of a sensing transistor according to characteristics of a light emitting unit.

Referring to FIGS. 5 and 6, the display device 10 in accordance with an embodiment of the disclosure may include a pixel PXL, a sensing unit 140, and a controller 160.

The pixel PXL is the pixel PXL illustrated in FIG. 4, and detailed configuration thereof is the same as that described with reference to FIG. 4. Although for the sake of description only one pixel PXL is illustrated in FIG. 5, the display panel of the display device 10 may include multiple pixels PXL.

The controller 160 may control turn-on or turn-off of a control transistor T0 and a sensing transistor Ts that are provided in each of the pixels PXL. Referring to FIG. 8, the controller 160 controls the control transistor T0 to be turned on by supplying an enable signal Enable to the control transistor T0, whereby the sensing transistor Ts is turned on. The enable signal Enable may be supplied at least once before the display device 10 according to the disclosure is commercialized and driven by the pixel circuit PXC.

Figure 10:
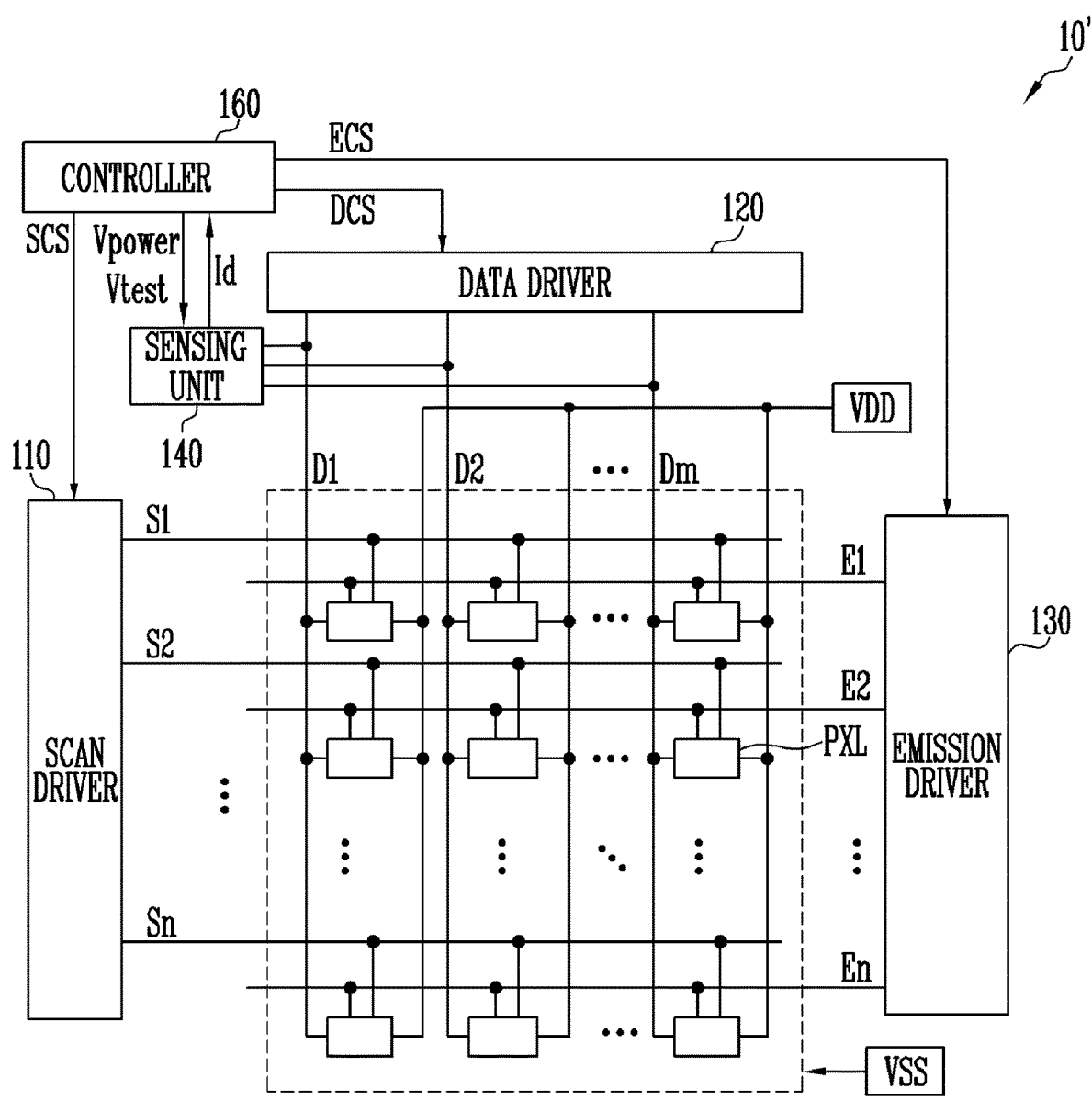
FIG. 10 is a schematic block diagram illustrating a display device in accordance with an embodiment of the disclosure.

Referring to FIG. 8, while the enable signal Enable is supplied to the control transistor T0, the controller 160 may supply a scan driver control signal SCS to the scan driver 110 (see, e.g., FIG. 10). The scan driver 110 may supply scan signals to the scan line Si in response to a scan driver control signal SCS supplied from the controller 160. Although for the sake of description FIG. 4 illustrates the i-th scan line Si as a representative example, the display device 10 may include multiple scan lines S1 to Sn that are electrically connected to multiple pixels PXL, respectively.

Still referring to FIG. 8, the scan driver 110 may supply scan signals to the scan lines S1 to Sn. If scan signals are supplied to the scan lines S1 to Sn, the pixels PXL may be selected on a horizontal line basis. Here, each scan signal may have a voltage level (a gate-on voltage) at which a transistor that is supplied with the scan signal can be turned on.

As shown in FIG. 8, while the enable signal Enable is supplied to the control transistor T0, the controller 160 may supply driving power Vpower and sensing power Vtest, which respectively have predetermined voltage levels, to the sensing unit 140.

While the enable signal Enable is supplied to the control transistor T0, the controller 160 may not generate a control signal (e.g., a data driver control signal, an emission driver control signal, etc.) such that the pixel circuit PXC is disabled. Hence, a driving signal (e.g., a data signal, an emission control signal, etc.) is not supplied from the pixel circuit PXC to the pixel PXL. If desired, the controller may supply an emission control signal so that current does not flow from the pixels PXL to the light emitting unit EMU.

The sensing unit 140 is electrically connected with the respective pixels PXL through data lines D1 to Dm (see, e.g., FIG. 10). In case that the sensing transistor Ts provided in each of the pixels PXL is turned on by the enable signal Enable and the scan signal, the sensing unit 140 may receive the driving power Vpower and the sensing power Vtest from the controller 160. The sensing unit 140 may perform a current sensing operation for the sensing transistor Ts in response to the received driving power Vpower and sensing power Vtest. In detail, the sensing unit 140 may sense or measure current Id flowing to the light emitting unit EMU, in response to the received driving power Vpower and sensing power Vtest.

The sensing unit 140 may transmit a measured current value to the controller 160. The current value measured by the sensing unit 140 may be provided to sense the number and/or alignment direction, etc. of the light emitting elements LD aligned in each of the pixels PXL.

To this end, the sensing unit 140 may include a sensing circuit, as illustrated in FIG. 6. Although for the sake of explanation FIG. 6 illustrates only one sensing circuit electrically connected to the j-th data line Dj, the sensing unit 140 may include multiple sensing circuits respectively connected to multiple data lines D1 to Dm.

Referring to FIG. 6, the sensing unit 140 may include a control unit 141, an amplifier amp, and a variable resistor Rd.

The amplifier amp may be an inverting amplifier and may include an input resistor R1 and a feedback resistor R2. An input terminal Vin of the amplifier amp may be electrically connected to the sensing transistor Ts via the data line Dj. A non-inverting input terminal V+ of the amplifier amp may be electrically connected to the controller 160 and may be supplied with the sensing power Vtest from the controller 160. In this embodiment, a voltage Vout on an output terminal of the amplifier amp may be obtained with Equation 1 below.

$$Vout = Vtest + \left(\frac{R1}{R2}\right)Vtest - \left(\frac{R1}{R2}\right)Vin \qquad \text{[Equation 1]}$$

The variable resistor Rd may be electrically connected between the controller 160 and the input terminal Vin of the amplifier amp. In an embodiment, the variable resistor Rd may be a digital variable resistor. In case that the driving power Vpower is supplied through the controller 160, the variable resistor Rd is controlled by the control unit 141 such that a voltage on the input terminal Vin of the amplifier amp is equal to the voltage of the sensing power Vtest.

In case that the voltage on the input terminal Vin is equal to the voltage of the sensing power Vtest, the voltage on the output terminal of the amplifier amp Vout is equal to the sensing power Vtest by Equation 1. Therefore, the control unit 141 may control the variable resistor Rd such that the voltage on the output terminal of the amplifier amp Vout is equal to the sensing power Vtest supplied from the controller 160.

With regard to the resistance value of the variable resistor Rd, in case that the voltage on the input terminal Vin is equal to the voltage of the sensing power Vtest, the current Id flowing through the light emitting unit EMU corresponding to a voltage Vd is determined by the following equation 2.

$$Id = \frac{(Vpower - Vtest)}{Rd} \qquad \text{[Equation 2]}$$

In other words, in the case where the value of the variable resistor Rd is determined, the current flowing to the light emitting unit EMU may be obtained by Equation 2.

In various embodiments of the disclosure, the sensing power Vtest may be set to be higher than the second power supply VSS, and the driving power Vpower may be set to be higher than the sensing power Vtest. In such embodiments, the current Id may flow from the data line Dj to the light emitting unit EMU via the sensing transistor Ts, as illustrated in FIG. 7A. The current Id may flow through at least one light emitting element LD electrically connected in the first direction among the light emitting elements LD forming the light emitting unit EMU.

In an embodiment of the disclosure, the sensing power Vtest may be set to be lower than the second power supply VSS, and the driving power Vpower may be set to be lower than the sensing power Vtest. In such an embodiment, the current Id may flow from the second power supply VSS to the data line Dj via the light emitting unit EMU and the sensing transistor Ts, as illustrated in FIG. 7B. The current Id may flow through at least one light emitting element LD electrically in the second direction among the light emitting elements LD constituting the light emitting unit EMU.

The amount of the current Id may correspond to the number N of at least one or more light emitting elements LD electrically connected in the first direction or the second direction, as illustrated in FIG. 9. For example, as the number N of light emitting elements LD electrically connected in a specific direction is increased, the amount of the current Id flowing through the sensing transistor Ts is increased. As the number N of light emitting elements LD electrically connected in the corresponding direction is reduced, the amount of the current Id flowing through the sensing transistor Ts is reduced.

The controller 160 may determine the alignment state of the light emitting elements LD in response to a current value sensed by the sensing unit 140 based on the foregoing characteristics.

FIG. 10 is a schematic plan view illustrating a display device in accordance with an embodiment of the disclosure.

Referring to FIG. 10, a display device 10' in accordance with an embodiment of the disclosure may further include a data driver 120 and an emission driver 130, compared to the configuration of the embodiment of FIG. 5. Descriptions of the same components as those of FIG. 5 are the same as that described with reference to FIG. 5; therefore, detailed descriptions thereof will be omitted.

In an embodiment of FIG. 10, the pixels PXL may be electrically connected with scan lines S1 to Sn, data lines D1 to Dm, and emission control lines E1 to En. The pixels PXL may be electrically connected with a first power supply VDD, a second power supply VSS, and an initialization power supply Vint. The pixels PXL may be supplied with scan signals from the scan lines S1 to Sn and may be supplied with data signals from the data lines D1 to Dm in synchronization with the scan signals. The pixels PXL supplied with the data signal may control the amount of current flowing from the first power supply VDD to the second power supply VSS via the light emitting unit EMU. In this case, the light emitting elements LD forming the light emitting unit EMU may generate light having a luminance corresponding to the amount of current.

The data driver 120 may supply data signals to the data lines D1 to Dm in response to a data control signal DCS. The data signals supplied to the data lines D1 to Dm may be supplied to pixels PXL selected by the respective scan signals. To this end, the data driver 120 may supply data signals to the data lines D1 to Dm in synchronization with scan signals.

The emission driver 130 may supply emission control signals to the emission control lines E1 to En in response to an emission driver control signal ECS supplied from the controller 160. Here, an emission control signal may have a voltage level at which a transistor that is supplied with the emission control signal can be turned off.

The controller 160 may generate a data driver control signal DCS, a scan driver control signal SCS, and an emission driver control signal ECS in response to control signals supplied from an external device. The scan driver control signal SCS may be supplied to the scan driver 110. The data driver control signal DCS may be supplied to the data driver 120. The emission driver control signal ECS may be supplied to the emission driver 130.

The controller 160 may translate image data input from an external device into image data corresponding to the specifications of the data driver 120, and then supply the image data to the data driver 120. The scan driver control signal SCS may include a scan start pulse and clock signals. The scan start pulse may control a supply timing of the scan signals, and the clock signals may be used to shift the scan start pulse. The emission driver control signal ECS may include an emission start pulse and clock signals. The emission start pulse may control a supply timing of an emission control signal, and the clock signals may be used to shift the emission start pulse.

The data driver control signal DCS may include a source start pulse, a source output enable signal, a source sampling clock, etc. The source start pulse may control a point in time at which a data sampling operation of the data driver 120 starts. The source sampling clock may control the sampling operation of the data driver 120 based on a rising or falling edge. The source output enable signal may control the output timing of the data driver 120.

FIG. 10 illustrates n scan lines S1 to Sn and n emission control lines E1 to En, but the disclosure is not limited thereto. For instance, dummy scan lines and/or dummy emission control lines may be additionally formed to secure the reliability of the operation. In FIG. 10, there is illustrated the case where the scan driver 110, the data driver 120, the emission driver 130, the sensing unit 140, and the controller 160 are individually provided, but at least some of the foregoing components may be integrated with each other if desired.

The scan driver 110, the data driver 120, the emission driver 130, the sensing unit 140, and the controller 160 may be installed using at least one of various forms, e.g., a chip-on-glass form, a chip-on-plastic form, a tape carrier package form, and a chip-on-film form.

Figure 11:
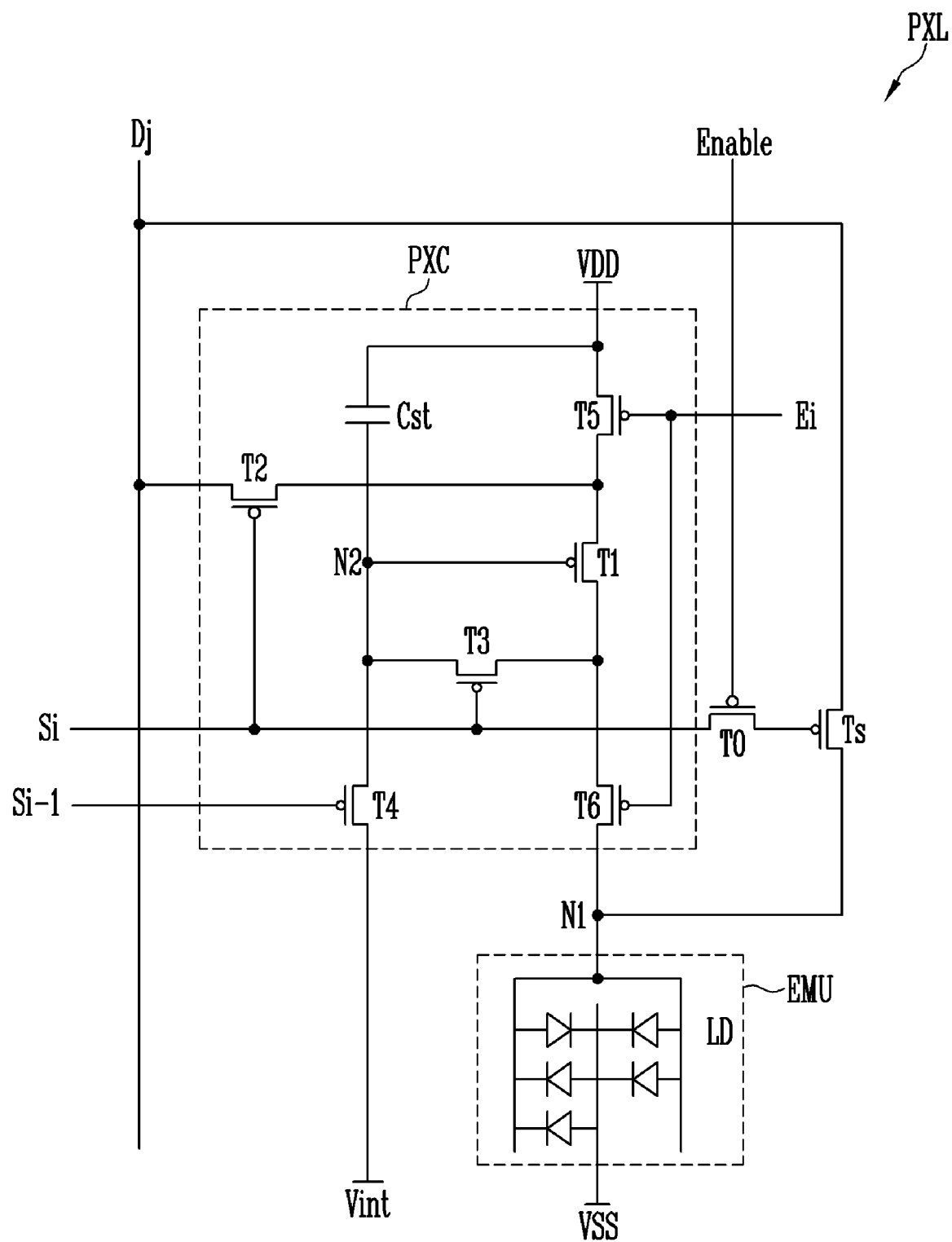
FIG. 11 is a schematic circuit diagram illustrating an embodiment of a pixel circuit.

FIG. 11 is a schematic circuit diagram illustrating an embodiment of a pixel circuit.

Referring to FIG. 11, the pixel circuit PXC may be electrically connected to an j-th data line Dj, an i−1-th scan line Si−1, an i-th scan line Si, and an i-th emission control line Ei. The pixel circuit PXC may include first to sixth transistors T1 to T6, and a storage capacitor Cst.

A source electrode of the first transistor (T1; driving transistor) may be electrically connected to the first power supply VDD via the fifth transistor T5, and a drain electrode thereof may be electrically connected to the first node N1 via the sixth transistor T6. Here, the first transistor T1 may control, in response to the voltage of the second node N2 electrically connected to a gate electrode of the first transistor T1, the amount of current flowing from the first power supply VDD to the second power supply VSS via the light emitting unit EMU.

The second transistor (T2; switching transistor) is electrically connected between the j-th data line Dj and the source electrode of the first transistor T1. A gate electrode of the second transistor T2 is electrically connected to the i-th scan line Si. The scan line Si is electrically connected to an output terminal 331 of the scan driver 110 (see, e.g., FIG. 13). In case that a scan signal is supplied to the i-th scan line Si, the second transistor T2 may be turned on to electrically connect the j-th data line Dj to the source electrode of the first transistor T1.

The third transistor T3 is electrically connected between the drain electrode of the first transistor T1 and the second node N2. A gate electrode of the third transistor T3 is electrically connected to the i-th scan line Si. In case that a scan signal is supplied to the i-th scan line Si, the third transistor T3 may be turned on to electrically connect the drain electrode of the first transistor T1 to the second node N2. Therefore, in case that the third transistor T3 is turned on, the first transistor T1 may be diode-connected.

The fourth transistor T4 may be electrically connected between the second node N2 and the initialization power supply Vint. A gate electrode of the fourth transistor T4 may be electrically connected to the i−1-th scan line Si−1. In case that a scan signal is supplied to the i−1-th scan line Si−1, the fourth transistor T4 is turned on to supply the voltage of the initialization power supply Vint to the second node N2. The initialization power supply Vint may be set to a voltage lower than that of a data signal.

The fifth transistor T5 may be electrically connected between the first power supply VDD and the source electrode of the first transistor T1. A gate electrode of the fifth transistor T5 may be electrically connected to the i-th emission control line Ei. The emission control line Ei is electrically connected to the output terminal 221 of the emission driver 130 (see, e.g., FIG. 12). The fifth transistor T5 may be turned off in case that an emission control signal is supplied to the i-th emission control line Ei and may be turned on in other cases.

The sixth transistor T6 is electrically connected between the drain electrode of the first transistor T1 and the first node N1. A gate electrode of the sixth transistor T6 is electrically connected to the i-th emission control line Ei. The sixth transistor T6 may be turned off in case that an emission control signal is supplied to the i-th emission control line Ei and may be turned on in other cases.

The storage capacitor Cst is electrically connected between the first power supply VDD and the second node N2. The storage capacitor Cst may store a voltage corresponding to a data signal and/or a threshold voltage of the first transistor T1.

Figure 12:
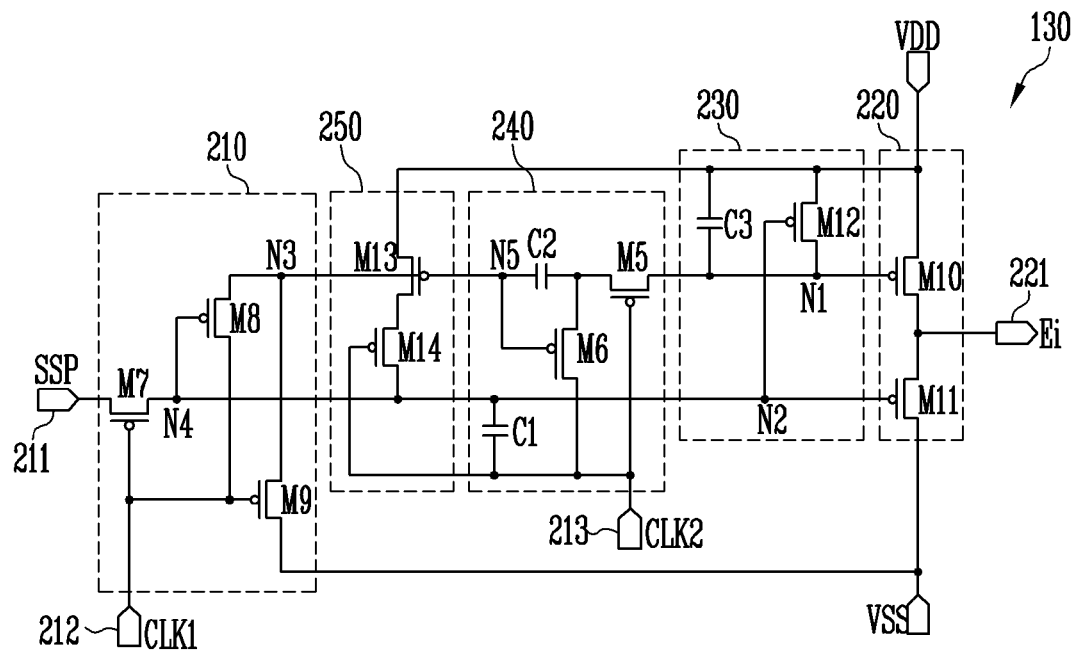
FIG. 12 is a schematic circuit diagram illustrating an embodiment of an emission driver.

FIG. 12 is a schematic circuit diagram illustrating an embodiment of an emission driver.

Referring to FIG. 12, the emission driver 130 may include an input component 210, an output component 220, a first signal processor 230, a second signal processor 240, and a third signal processor 250.

The output component 220 may supply the voltage of the first power supply VDD or the second power supply VSS to an output terminal 221 in response to voltages of a first node N1 and a second node N2. To this end, the output component 220 may include a tenth transistor M10 and an eleventh transistor M11.

The tenth transistor M10 is electrically connected between the first power supply VDD and the output terminal 221. A gate electrode of the tenth transistor M10 is electrically connected to the first node N1. The tenth transistor M10 may be turned on or off in response to the voltage of the first node N1. Here, the voltage of the first power supply VDD that is supplied to the output terminal 221 in case that the tenth transistor M10 is turned on may be used as an emission control signal of the emission control line Ei.

The eleventh transistor M11 is electrically connected between the output terminal 221 and the second power supply VSS. A gate electrode of the eleventh transistor M11 is electrically connected to the second node N2. The eleventh transistor M11 may be turned on or off in response to the voltage of the second node N2.

The input component 210 may control the voltages of a third node N3 and a fourth node N4 in response to signals supplied to a first input terminal 211 and a second input terminal 212. To this end, the input component 210 may include a seventh transistor M7 to a ninth transistor M9.

The seventh transistor M7 is electrically connected between the first input terminal 211 and the fourth node N4. A gate electrode of the seventh transistor M7 is electrically connected to the second input terminal 212. In case that a first clock signal CLK1 is supplied to the second input terminal 212, the seventh transistor M7 is turned on to electrically connect the first input terminal 211 with the fourth node N4. An input signal SSP is supplied to the first input terminal 211.

The eighth transistor M8 is electrically connected between the third node N3 and the second input terminal 212. A gate electrode of the eighth transistor M8 is electrically connected to the fourth node N4. The eighth transistor M8 may be turned on or off in response to the voltage of the fourth node N4.

The ninth transistor M9 is electrically connected between the third node N3 and the second power supply VSS. A gate electrode of the ninth transistor M9 is electrically connected to the second input terminal 212. In case that the first clock signal CLK1 is supplied to the second input terminal 212, the ninth transistor M9 may be turned on so that the voltage of the second power supply VSS may be supplied to the third node N3.

The first signal processor 230 may control the voltage of the first node N1 in response to the voltage of the second node N2. To this end, the first signal processor 230 may include a twelfth transistor M12 and a third capacitor C3.

The twelfth transistor M12 is electrically connected between the first power supply VDD and the first node N1. A gate electrode of the twelfth transistor M12 is electrically connected to the second node N2. The twelfth transistor M12 may be turned on or off in response to the voltage of the second node N2.

The third capacitor C3 is electrically connected between the first power supply VDD and the first node N1. The third capacitor C3 may store a voltage to be applied to the first node N1 and may stably maintain the voltage of the first node N1.

The second signal processor 240 is electrically connected to a fifth node N5 and may control the voltage of the first node N1 in response to a signal supplied to the third input terminal 213. To this end, the second signal processor 240 may include a fifth transistor M5, a sixth transistor M6, a first capacitor C1, and a second capacitor C2.

The first capacitor C1 is electrically connected between the second node N2 and the third input terminal 213. The first capacitor C1 may store a voltage to be applied to the second node N2. The first capacitor C1 controls the voltage of the second node N2 in response to the second clock signal CLK2 supplied to the third input terminal 213.

A first terminal of the second capacitor C2 is electrically connected to the fifth node N5, and a second terminal thereof is electrically connected to the fifth transistor M5.

The fifth transistor M5 is electrically connected between the second terminal of the second capacitor C2 and the first node N1. A gate electrode of the fifth transistor M5 is electrically connected to the third input terminal 213. In case that the second clock signal CLK2 is supplied to the third input terminal 203, the fifth transistor M5 is turned on to electrically connect the second terminal of the second capacitor C2 with the first node N1.

The sixth transistor M6 is electrically connected between the second terminal of the second capacitor C2 and the third input terminal 213. A gate electrode of the sixth transistor M6 is electrically connected to the fifth node N5. The sixth transistor M6 may be turned on or off in response to the voltage of the fifth node N5.

The third signal processor 250 may control the voltage of the fourth node N4 in response to the voltage of the third node N3 and a signal supplied to the third input terminal 213. To this end, the third signal processor 250 may include a thirteenth transistor M13 and a fourteenth transistor M14.

The thirteenth transistor M13 and the fourteenth transistor M14 are connected in series between the first power supply VDD and the fourth node N4. A gate electrode of the thirteenth transistor M13 is electrically connected to the third node N3. The thirteenth transistor M13 may be turned on or off in response to the voltage of the third node N3.

A gate electrode of the fourteenth transistor M14 is electrically connected to the third input terminal 213. The fourteenth transistor M14 may be turned on in case that the second clock signal CLK2 is supplied to the third input terminal 213.

The embodiment illustrated in FIG. 12 is an embodiment of the emission driver 130, and the emission driver 130 of the disclosure is not limited to the foregoing structure. For example, the emission driver 130 may further include a stabilizer, etc., provided between signal processors.

Figure 13:
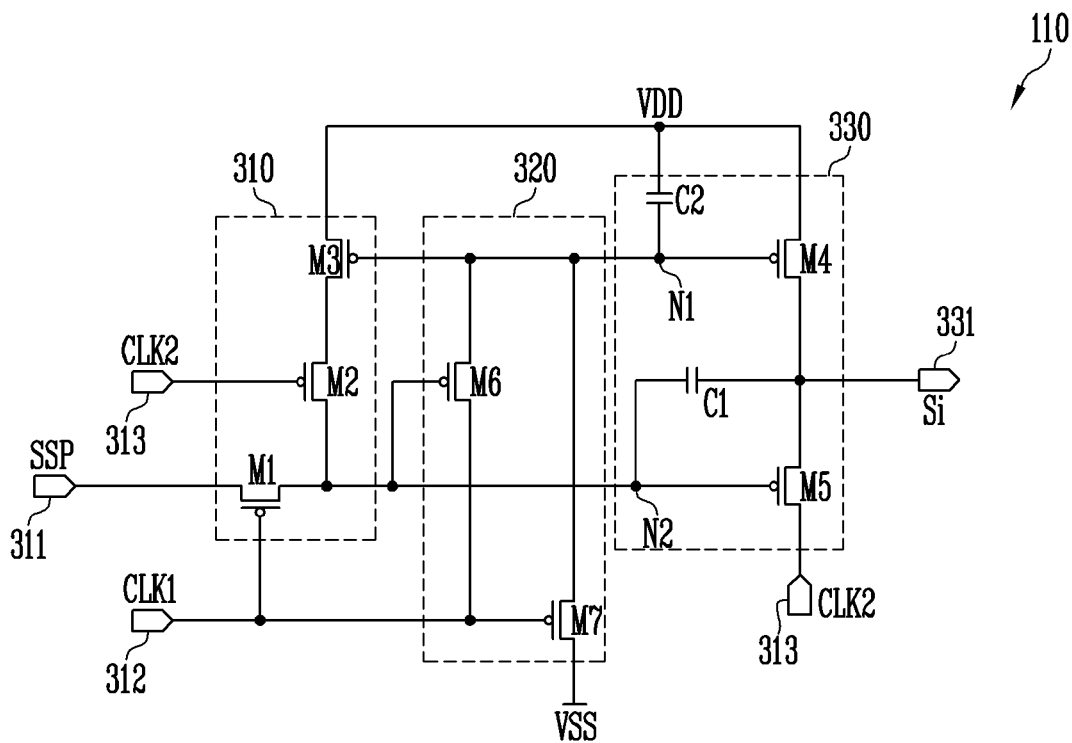
FIG. 13 is a schematic circuit diagram illustrating an embodiment of a scan driver.

FIG. 13 is a schematic circuit diagram illustrating an embodiment of a scan driver.

Referring to FIG. 13, the scan driver 110 includes a first driver 310, a second driver 320, and an output component 330.

The output component 330 controls a voltage to be supplied to an output terminal 331 in response to voltages applied to a first node N1 and a second node N2. To this end, the output component 330 includes a fourth transistor M4, a fifth transistor M5, a first capacitor C1, and a second capacitor C2.

The fourth transistor M4 is disposed between the first power supply VDD and an output terminal 331, and a gate electrode thereof is electrically connected to the first node N1. The fourth transistor M4 controls connection between the first power supply VDD and the output terminal 331 in response to a voltage applied to the first node N1. Here, the first power supply VDD is set to a gate-off voltage, e.g., a high-level voltage.

The fifth transistor M5 is disposed between the output terminal 331 and a third input terminal 313, and a gate electrode thereof is electrically connected to the second node N2. The fifth transistor M5 controls connection between the output terminal 331 and the third input terminal 313 in response to a voltage applied to the second node N2.

The first capacitor C1 is electrically connected between the second node N2 and the output terminal 331. The first capacitor C1 may store a voltage corresponding to turn-on and turn-off of the fifth transistor M5.

The second capacitor C2 is electrically connected between the first node N1 and the first power supply VDD. The second capacitor C2 may store a voltage to be applied to the first node N1.

The first driver 310 may controls the voltage of the second node N2 in response to signals supplied to the first input terminal 311 to the third input terminal 313. To this end, the first driver 310 includes a first transistor M1 to a third transistor M3.

The first transistor M1 is disposed between the first input terminal 311 and the second node N2, and a gate electrode thereof is electrically connected to the second input terminal 312. The first transistor M1 controls connection between the first input terminal 311 and the second node N2 in response to a voltage supplied to the second input terminal 312.

The second transistor M2 and the third transistor M3 are connected in series between the second node N2 and the first power supply VDD. Substantially, the second transistor M2 is disposed between the third transistor M3 and the second node N2, and a gate electrode thereof is electrically connected to the third input terminal 313. The second transistor M2 controls connection between the third transistor M3 and the second node N2 in response to a voltage supplied to the third input terminal 313.

The third transistor M3 is disposed between the second transistor M2 and the first power supply VDD, and a gate electrode thereof is electrically connected to the first node N1. The third transistor M3 may control connection between the second transistor M2 and the first power supply VDD in response to the voltage of the first node N1.

The second driver 320 may control the voltage of the first node N1 in response to the voltages of the second input terminal 312 and the second node N2. To this end, the second driver 320 includes a sixth transistor M6 and a seventh transistor M7.

The sixth transistor M6 is disposed between the first node N1 and the second input terminal 312, and a gate electrode thereof is electrically connected to the second node N2. The sixth transistor M6 controls connection between the first node N1 and the second input terminal 312 in response to the voltage of the second node N2.

The seventh transistor M7 is disposed between the first node N1 and the second power supply VSS, and a gate electrode thereof is electrically connected to the second input terminal 312. The seventh transistor M7 may control connection between the first node N1 and the second power supply VSS in response to the voltage of the second input terminal 312. Here, the second power supply VSS is set to a gate-on voltage, e.g., a low-level voltage.

The embodiment illustrated in FIG. 13 is an embodiment of the scan driver 110, and the scan driver 110 of the disclosure is not limited to the foregoing structure, and an arbitrary shift register may be used as the scan driver 110 or in lieu of the scan driver 110.

Figure 14:
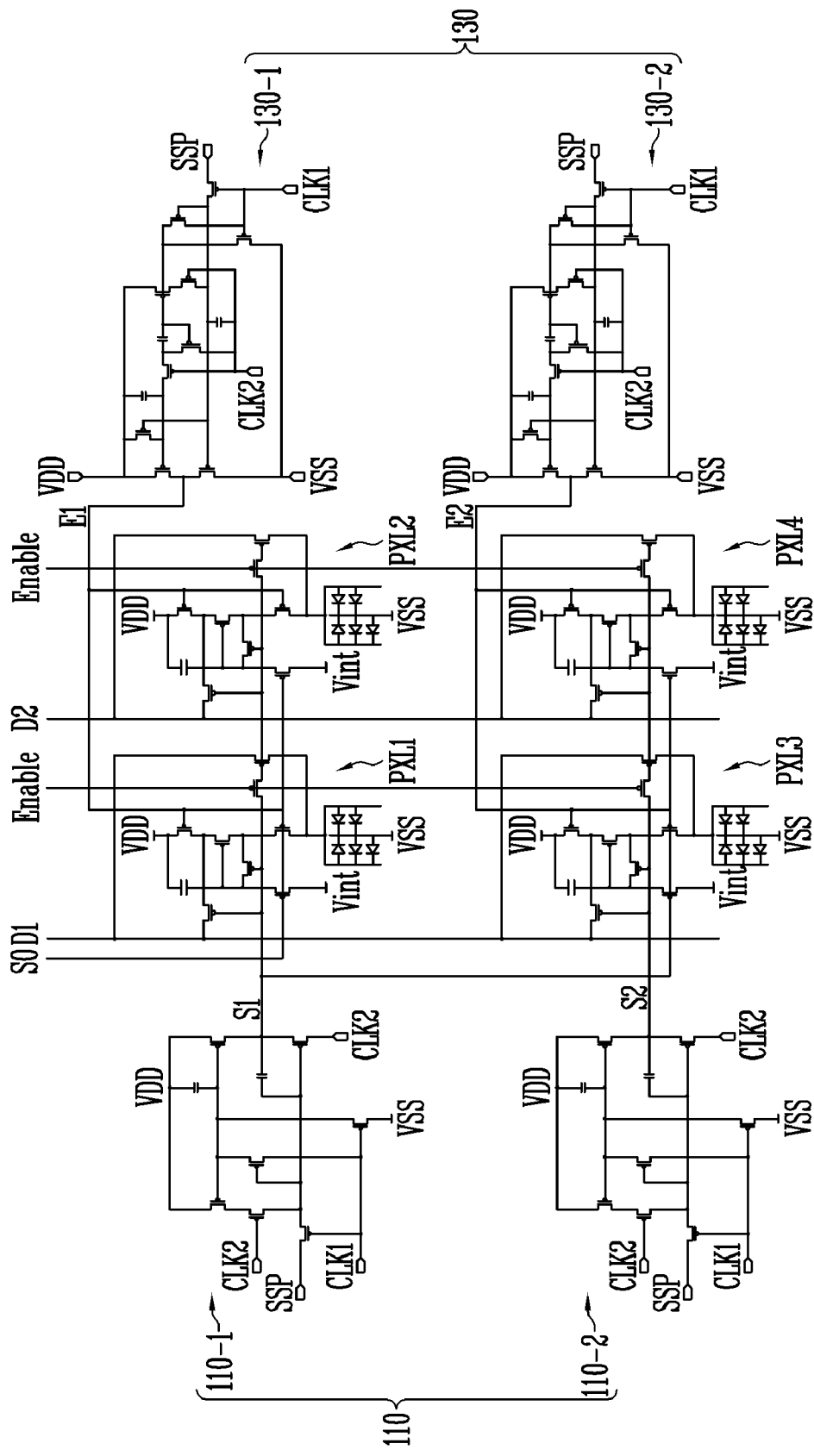
FIG. 14 is a schematic circuit diagram illustrating in detail the display device of FIG. 10.

FIG. 14 is a schematic circuit diagram illustrating in detail the display device of FIG. 10. FIG. 14 illustrates in detail connection relationship between pixels PXL1 to PXL4 (or sub-pixels) constituting the display panel, the scan driver 110, and the emission driver 130 in the display device 10' of FIG. 10.

Referring to FIG. 14, the pixels PXL1 to PXL4 may be electrically connected with scan lines S0 to Sn, data lines D1 to Dm, and emission control lines E1 to En. In addition, the pixels PXL1 to PXL4 may be electrically connected with a first power supply VDD, a second power supply VSS, and an initialization power supply Vint. The pixels PXL1 to PXL4 may be supplied with scan signals from the scan lines S0 to Sn and may be supplied with data signals from the data lines D1 to Dm in synchronization with the scan signals. The pixels PXL1 to PXL4 supplied with the data signal may control the amount of current flowing from the first power supply VDD to the second power supply VSS via the light emitting unit EMU. In this case, the light emitting elements LD forming the light emitting unit EMU may generate light having a luminance corresponding to the amount of current.

Each of the pixels PXL1 to PXL4 is the pixel PXL illustrated in FIG. 4, and detailed configuration thereof is the same as that described with reference to FIG. 4.

The scan driver 110 may include scan driving stages 110-1, 110-2, . . . , 110-n (not illustrated) which are respectively and electrically connected to the scan lines S0 to Sn. The scan driver 110 may supply scan signals to the scan lines S0 to Sn through the respective scan driving stages 110-1, 110-2, . . . , 110-n. If scan signals are supplied to the scan lines S0 to Sn, the pixels PXL1 to PXL4 may be selected on a horizontal line basis. Here, each scan signal may have a voltage level (a gate-on voltage) at which a transistor that is supplied with the scan signal can be turned on.

Each of the scan driving stages 110-1, 110-2, . . . , 110-n may have the same circuit configuration as that of the scan driver 110 illustrated in FIG. 13.

The emission driver 130 may include emission driving stages 130-1, 130-2, . . . , 130-n (not illustrated) which are respectively and electrically connected to the emission control lines E1 to En. The emission driver 130 may supply emission control signals to the emission control lines E1 to En through the respective emission driving stages 130-1, 130-2, . . . , 130-*n*. Here, an emission control signal may have a voltage level at which a transistor that is supplied with the emission control signal can be turned off.

Each of the emission driving stages 130-1, 130-2, . . . , 130-*n* may have the same circuit configuration as that of the emission driver 130 illustrated in FIG. 12.

It will be understood to those skilled in the art that the disclosure may be implemented in different specific forms without changing the technical ideas or essential characteristics. Therefore, it should be understood that the exemplary embodiments are only for illustrative purposes and do not limit the bounds of the disclosure. It is intended that the bounds of the disclosure are defined by the accompanying claims, and various modifications, additions and substitutions, which can be derived from the meaning, scope and equivalent concepts of the accompanying claims, fall within the bounds of the disclosure.

What is claimed is:

1. A pixel comprising:
a light emitting unit configured of first light emitting elements disposed such that current flows through the first light emitting elements in a first direction and second light emitting elements disposed such that current flows through the second light emitting elements in a second direction opposite to the first direction;
a pixel circuit configured to supply current to the light emitting unit in response to a data signal;
a sensing transistor disposed in a controller and electrically connected between a data line and a first node that is a common node of the light emitting unit and the pixel circuit; and
a control transistor disposed in the controller and electrically connected between a scan line and a gate electrode of the sensing transistor, wherein the current flowing to the light emitting unit is determined based on an alignment direction and a number of the first light emitting elements and the second light emitting elements, wherein
the controller determines the number of the first light emitting elements aligned in the first direction based on the current, and
the controller determines the number of the second light emitting elements aligned in the second direction based on the current.

2. The pixel according to claim 1, wherein, while an enable signal is supplied from an external device to the control transistor, the control transistor is turned on so that the scan line and the sensing transistor are electrically connected to each other.

3. The pixel according to claim 2, wherein the sensing transistor is turned on by a scan signal supplied from the scan line so that the data line and the light emitting unit are electrically connected to each other.

4. A display device comprising:
a pixel comprising:
a light emitting unit configured of first light emitting elements disposed such that current flows through the first light emitting elements in a first direction and second light emitting elements disposed such that current flows through the second light emitting elements in a second direction opposite to the first direction;
a pixel circuit configured to supply current to the light emitting unit in response to a data signal; and
a sensing transistor electrically connected between a data line and a first node that is a common node of the light emitting unit and the pixel circuit;
a sensing unit electrically connected with the data line and configured to sense current flowing to the light emitting unit when the sensing transistor is turned on; and
a controller configured to determine an alignment direction and a number of the first light emitting elements and the second light emitting elements based on the current sensed by the sensing unit, wherein
the controller determines the number of the first light emitting elements aligned in the first direction based on the current sensed by the sensing unit, and
the controller determines the number of the second light emitting elements aligned in the second direction based in the current sensed by the sensing unit.

5. The display device according to claim 4, wherein the pixel further comprises a control transistor electrically connected between a scan line and a gate electrode of the sensing transistor.

6. The display device according to claim 5, wherein the controller supplies an enable signal to the control transistor of the pixel so that the control transistor is turned on.

7. The display device according to claim 6, wherein, when the control transistor of the pixel is turned on, the sensing transistor is electrically connected with the scan line and is turned on in response to a scan signal supplied from the scan line so that the data line and the light emitting unit are electrically connected to each other.

8. The display device according to claim 7, wherein, while the enable signal is supplied to the control transistor of the pixel, the pixel circuit is disabled.

9. The display device according to claim 7, wherein the sensing unit comprises:
an amplifier including:
an input terminal electrically connected to the sensing transistor; and
an output terminal;
a variable resistor electrically connected between the input terminal of the amplifier and the controller; and
a control unit configured to determine current flowing to the light emitting unit based on an output voltage of the output terminal of the amplifier and a resistance value of the variable resistor.

10. The display device according to claim 9, wherein, while the enable signal is supplied to the control transistor of the pixel, the controller supplies driving power to the variable resistor and supplies test power to a non-inverting input terminal of the amplifier.

11. The display device according to claim 10, wherein the control unit controls the resistance value of the variable resistor such that the output voltage of the amplifier is equal to a voltage of the test power.

12. The display device according to claim 11, wherein the control unit determines current flowing to the light emitting unit based on the driving power, the test power, and the controlled resistance value of the variable resistor.

13. The display device according to claim 12, wherein the current flowing to the light emitting unit is determined based on the alignment direction and the number of the first light emitting elements and the second light emitting elements.

14. The display device according to claim 12, wherein the light emitting unit is electrically connected between the first node and a power supply.

15. The display device according to claim 14, wherein the first light emitting elements and the second light emitting elements are aligned in either the first direction in which current flows from the first node to the power supply or the second direction in which current flows from the power supply to the first node.

16. The display device according to claim 15, wherein
the driving power is set to be higher than sensing power, and
the sensing power is set to be higher than power supplied by the power supply.

17. The display device according to claim 15, wherein
the driving power is set to be lower than sensing power, and
the sensing power is set to be lower than power supplied by the power supply.

\* \* \* \* \*